(12) United States Patent
Dadashev et al.

(10) Patent No.: US 7,532,529 B2
(45) Date of Patent: May 12, 2009

(54) APPARATUS AND METHODS FOR MULTI-LEVEL SENSING IN A MEMORY ARRAY

(75) Inventors: Oleg Dadashev, Hadera (IL); Yoram Betser, Mazkeret Batya (IL); Eduardo Maayan, Kfar Saba (IL)

(73) Assignee: Saifun Semiconductors Ltd., Netanya (IL)

( * ) Notice: Subject to any disclaimer, the term of this patent is extended or adjusted under 35 U.S.C. 154(b) by 182 days.

(21) Appl. No.: 11/464,253

(22) Filed: Aug. 14, 2006

(65) Prior Publication Data

US 2006/0285402 A1    Dec. 21, 2006

Related U.S. Application Data

(63) Continuation of application No. 10/810,683, filed on Mar. 29, 2004, now Pat. No. 7,142,464.

(51) Int. Cl.
*G11C 7/02* (2006.01)

(52) U.S. Cl. ................. 365/207; 365/189.07; 365/210.1

(58) Field of Classification Search ................... 327/56, 327/68, 70, 76, 80; 365/210.15, 185.21, 365/189.07, 207, 210.1
See application file for complete search history.

(56) References Cited

U.S. PATENT DOCUMENTS

| | | | |
|---|---|---|---|
| 3,881,180 A | 4/1975 | Gosney, Jr. |
| 3,895,360 A | 7/1975 | Cricchi et al. |
| 3,952,325 A | 4/1976 | Beale et al. |
| 4,016,588 A | 4/1977 | Ohya et al. |
| 4,017,888 A | 4/1977 | Christie et al. |
| 4,145,703 A | 3/1979 | Blanchard et al. |
| 4,151,021 A | 4/1979 | McElroy |
| 4,173,766 A | 11/1979 | Hayes |
| 4,173,791 A | 11/1979 | Bell |
| 4,247,861 A | 1/1981 | Hsu et al. |
| 4,257,832 A | 3/1981 | Schwabe et al. |
| 4,281,397 A | 7/1981 | Neal et al. |
| 4,306,353 A | 12/1981 | Jacobs et al. |
| 4,342,102 A | 7/1982 | Puar |

(Continued)

FOREIGN PATENT DOCUMENTS

EP    0 656 628    6/1995

(Continued)

OTHER PUBLICATIONS

Bude et al., EEPROM/Flash Sub 3.0V drain—Source Bias Hot Carrier Writing, IEDM, 1995, pp. 989-992.

(Continued)

*Primary Examiner*—Anh Phung
*Assistant Examiner*—Alexander Sofocleous
(74) *Attorney, Agent, or Firm*—EMPK & Shiloh, LLP

(57) ABSTRACT

A method for sensing a signal received from an array cell within a memory array, the method comprising the steps of generating an analog voltage Vddr proportional to a current of a selected array cell of the memory array, and comparing the analog voltage Vddr with a reference analog voltage Vcomp to generate an output digital signal. A method is also provided for sensing a memory cell by transforming a signal from a memory cell to a time delay, and sensing the memory cell by comparing the time delay to a time delay of a reference cell. Related apparatus is also disclosed.

20 Claims, 10 Drawing Sheets

U.S. PATENT DOCUMENTS

| | | |
|---|---|---|
| 4,342,149 A | 8/1982 | Jacobs et al. |
| 4,360,900 A | 11/1982 | Bate |
| 4,373,248 A | 2/1983 | McElroy |
| 4,380,057 A | 4/1983 | Kotecha et al. |
| 4,388,705 A | 6/1983 | Sheppard |
| 4,389,705 A | 6/1983 | Sheppard |
| 4,404,747 A | 9/1983 | Collins |
| 4,435,786 A | 3/1984 | Tickle |
| 4,448,400 A | 5/1984 | Harari |
| 4,471,373 A | 9/1984 | Shimizu et al. |
| 4,494,016 A | 1/1985 | Ransom et al. |
| 4,507,673 A | 3/1985 | Aoyama |
| 4,521,796 A | 6/1985 | Rajkanan et al. |
| 4,527,257 A | 7/1985 | Cricchi |
| 4,586,163 A | 4/1986 | Koike |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,725,984 A | 2/1988 | Ip et al. |
| 4,733,105 A | 3/1988 | Shin et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,847,808 A | 7/1989 | Kobatake |
| 4,857,770 A | 8/1989 | Partovi et al. |
| 4,870,470 A | 9/1989 | Bass, Jr. et al. |
| 4,888,735 A | 12/1989 | Lee et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,029,063 A | 7/1991 | Lingstaedt et al. |
| 5,042,009 A | 8/1991 | Kazerounian et al. |
| 5,075,245 A | 12/1991 | Woo et al. |
| 5,081,371 A | 1/1992 | Wong |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,092 A | 3/1994 | Hotta et al. |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,334,555 A | 8/1994 | Sugiyama et al. |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,375,094 A | 12/1994 | Naruke |
| 5,381,374 A | 1/1995 | Shiraishi et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,434,825 A | 7/1995 | Harari et al. |
| 5,436,478 A | 7/1995 | Bergemont et al. |
| 5,436,481 A | 7/1995 | Egawa et al. |
| 5,440,505 A | 8/1995 | Fazio et al.. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,508,968 A | 4/1996 | Collins et al. |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,018 A | 9/1996 | Wang et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,566,125 A | 10/1996 | Fazio et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee et al. |
| 5,604,804 A | 2/1997 | Micali |
| 5,606,523 A | 2/1997 | Mirabel |
| 5,608,679 A | 3/1997 | Mi et al. |
| 5,612,642 A | 3/1997 | McClinyock |
| 5,617,357 A | 4/1997 | Haddad et al. |
| 5,623,438 A | 4/1997 | Guritz et al. |
| 5,627,790 A | 5/1997 | Golla et al. |
| 5,633,603 A | 5/1997 | Lee |
| 5,636,288 A | 6/1997 | Bonneville et al. |
| 5,644,531 A | 7/1997 | Kuo et al. |

| | | | | | | |
|---|---|---|---|---|---|---|
| 5,654,568 A | 8/1997 | Nakao | | 5,920,507 A | 7/1999 | Takeuchi et al. |
| 5,656,513 A | 8/1997 | Wang et al. | | 5,926,409 A | 7/1999 | Engh et al. |
| 5,657,332 A | 8/1997 | Auclair et al. | | 5,930,195 A | 7/1999 | Komatsu et al. |
| 5,661,060 A | 8/1997 | Gill et al. | | 5,933,366 A * | 8/1999 | Yoshikawa ............. 365/185.03 |
| 5,663,907 A | 9/1997 | Frayer et al. | | 5,933,367 A | 8/1999 | Matsuo et al. |
| 5,666,365 A | 9/1997 | Kostreski | | 5,936,888 A | 8/1999 | Sugawara |
| 5,672,959 A | 9/1997 | Der | | 5,940,332 A | 8/1999 | Artieri |
| 5,675,280 A | 10/1997 | Nomura | | 5,946,258 A | 8/1999 | Evertt et al. |
| 5,677,867 A | 10/1997 | Hazani | | 5,946,558 A | 8/1999 | Hsu |
| 5,677,869 A | 10/1997 | Fazio et al. | | 5,949,714 A | 9/1999 | Hemink et al. |
| 5,683,925 A | 11/1997 | Irani et al. | | 5,949,728 A | 9/1999 | Liu et al. |
| 5,689,459 A | 11/1997 | Chang et al. | | 5,959,311 A | 9/1999 | Shih et al. |
| 5,694,356 A | 12/1997 | Wong et al. | | 5,963,412 A | 10/1999 | En |
| 5,696,929 A | 12/1997 | Hasbun et al. | | 5,963,465 A | 10/1999 | Eitan |
| 5,708,608 A | 1/1998 | Park et al. | | 5,966,603 A | 10/1999 | Eitan |
| 5,712,814 A | 1/1998 | Fratin et al. | | 5,969,989 A | 10/1999 | Iwahashi |
| 5,712,815 A | 1/1998 | Bill et al. | | 5,969,993 A | 10/1999 | Takeshima |
| 5,715,193 A | 2/1998 | Norman | | 5,973,373 A | 10/1999 | Krautschneider et al. |
| 5,717,581 A | 2/1998 | Canclini | | 5,982,666 A | 11/1999 | Campardo |
| 5,717,632 A | 2/1998 | Richart et al. | | 5,986,940 A | 11/1999 | Atsumi et al. |
| 5,717,635 A | 2/1998 | Akatsu | | 5,990,526 A | 11/1999 | Bez et al. |
| 5,721,781 A | 2/1998 | Deo et al. | | 5,991,202 A | 11/1999 | Derhacobian et al. |
| 5,726,946 A | 3/1998 | Yamagata et al. | | 5,999,444 A | 12/1999 | Fujiwara et al. |
| 5,748,534 A | 5/1998 | Dunlap et al. | | 5,999,494 A | 12/1999 | Holzrichter |
| 5,751,037 A | 5/1998 | Aozasa et al. | | 6,000,006 A | 12/1999 | Bruce et al. |
| 5,751,637 A | 5/1998 | Chen et al. | | 6,005,423 A | 12/1999 | Schultz |
| 5,754,475 A | 5/1998 | Bill et al. | | 6,011,725 A | 1/2000 | Eitan |
| 5,760,445 A | 6/1998 | Diaz | | 6,018,186 A | 1/2000 | Hsu |
| 5,760,634 A | 6/1998 | Fu | | 6,020,241 A | 2/2000 | You et al. |
| 5,768,192 A | 6/1998 | Eitan | | 6,028,324 A | 2/2000 | Su et al. |
| 5,768,193 A | 6/1998 | Lee et al. | | 6,030,871 A | 2/2000 | Eitan |
| 5,771,197 A | 6/1998 | Kim | | 6,034,403 A | 3/2000 | Wu |
| 5,774,395 A | 6/1998 | Richart et al. | | 6,034,896 A | 3/2000 | Ranaweera et al. |
| 5,777,919 A | 7/1998 | Chi-Yung et al. | | 6,037,627 A | 3/2000 | Kitamura et al. |
| 5,781,476 A | 7/1998 | Seki et al. | | 6,040,610 A | 3/2000 | Noguchi et al. |
| 5,781,478 A | 7/1998 | Takeuchi et al. | | 6,044,019 A | 3/2000 | Cernea et al. |
| 5,783,934 A | 7/1998 | Tran | | 6,044,022 A | 3/2000 | Nachumovsky |
| 5,784,314 A | 7/1998 | Sali et al. | | 6,063,666 A | 5/2000 | Chang et al. |
| 5,787,036 A | 7/1998 | Okazawa | | 6,064,226 A | 5/2000 | Earl |
| 5,793,079 A | 8/1998 | Georgescu et al. | | 6,064,251 A | 5/2000 | Park |
| 5,801,076 A | 9/1998 | Ghneim et al. | | 6,064,591 A | 5/2000 | Takeuchi et al. |
| 5,805,500 A | 9/1998 | Campardo et al. | | 6,074,916 A | 6/2000 | Cappelletti |
| 5,808,506 A | 9/1998 | Tran | | 6,075,402 A | 6/2000 | Ghilardelli |
| 5,812,449 A | 9/1998 | Song | | 6,075,724 A | 6/2000 | Li et al. |
| 5,812,456 A | 9/1998 | Hull et al. | | 6,078,518 A | 6/2000 | Chevallier |
| 5,812,457 A | 9/1998 | Arase | | 6,081,456 A | 6/2000 | Dadashev |
| 5,815,435 A | 9/1998 | Van Tran | | 6,084,794 A | 7/2000 | Lu et al. |
| 5,821,792 A * | 10/1998 | Miwa ......................... 327/215 | | 6,091,640 A | 7/2000 | Kawahara et al. |
| 5,822,256 A | 10/1998 | Bauer et al. | | 6,094,095 A | 7/2000 | Murray et al. |
| 5,825,683 A | 10/1998 | Chang et al. | | 6,097,639 A | 8/2000 | Choi et al. |
| 5,825,686 A | 10/1998 | Schmitt-Landsiedel et al. | | 6,107,862 A | 8/2000 | Mukainakano et al. |
| 5,828,601 A | 10/1998 | Hollmer et al. | | 6,108,240 A | 8/2000 | Lavi et al. |
| 5,834,851 A | 11/1998 | Ikeda et al. | | 6,108,241 A | 8/2000 | Chevallier |
| 5,835,935 A | 11/1998 | Estakhri et al. | | 6,117,714 A | 9/2000 | Beatty |
| 5,836,772 A | 11/1998 | Chang et al. | | 6,118,207 A | 9/2000 | Ormerod et al. |
| 5,841,700 A | 11/1998 | Chang | | 6,118,692 A | 9/2000 | Banks |
| 5,847,441 A | 12/1998 | Cutter et al. | | 6,122,198 A | 9/2000 | Haddad et al. |
| 5,861,771 A | 1/1999 | Matsuda et al. | | 6,128,226 A | 10/2000 | Eitan et al. |
| 5,862,076 A | 1/1999 | Eitan | | 6,128,227 A | 10/2000 | Kim |
| 5,864,164 A | 1/1999 | Wen | | 6,130,572 A | 10/2000 | Ghilardelli et al. |
| 5,867,429 A | 2/1999 | Chen et al. | | 6,130,574 A | 10/2000 | Bloch et al. |
| 5,870,334 A | 2/1999 | Hemink et al. | | 6,133,095 A | 10/2000 | Eitan et al. |
| 5,870,335 A | 2/1999 | Khan et al. | | 6,134,156 A | 10/2000 | Eitan |
| 5,872,848 A | 2/1999 | Romney et al. | | 6,137,718 A | 10/2000 | Reisinger |
| 5,875,128 A | 2/1999 | Ishizuka et al. | | 6,147,904 A | 11/2000 | Liron |
| 5,877,537 A | 3/1999 | Aoki | | 6,147,906 A | 11/2000 | Bill et al. |
| 5,880,620 A | 3/1999 | Gitlin et al. | | 6,150,800 A | 11/2000 | Kinoshita et al. |
| 5,886,927 A | 3/1999 | Takeuchi | | 6,154,081 A | 11/2000 | Pakkala et al. |
| RE36,179 E | 4/1999 | Shimoda | | 6,156,149 A | 12/2000 | Cheung et al. |
| 5,892,710 A | 4/1999 | Fazio et al. | | 6,157,242 A | 12/2000 | Fukui |
| 5,903,031 A | 5/1999 | Yamada et al. | | 6,157,570 A | 12/2000 | Nachumovsky |
| 5,910,924 A | 6/1999 | Tanaka et al. | | 6,163,048 A | 12/2000 | Hirose et al. |
| 5,920,503 A | 7/1999 | Lee et al. | | 6,163,484 A | 12/2000 | Uekubo |

| Patent No. | Date | Inventor(s) |
|---|---|---|
| 6,169,691 B1 | 1/2001 | Pasotti et al. |
| 6,175,523 B1 | 1/2001 | Yang et al. |
| 6,181,597 B1 | 1/2001 | Nachumovsky |
| 6,181,605 B1 | 1/2001 | Hollmer et al. |
| 6,185,143 B1 | 2/2001 | Perner et al. |
| 6,188,211 B1 | 2/2001 | Rincon-Mora et al. |
| 6,190,966 B1 | 2/2001 | Ngo et al. |
| 6,192,445 B1 | 2/2001 | Rezvani |
| 6,195,196 B1 | 2/2001 | Kimura et al. |
| 6,198,342 B1 | 3/2001 | Kawai |
| 6,201,282 B1 | 3/2001 | Eitan |
| 6,201,737 B1 | 3/2001 | Hollmer et al. |
| 6,205,055 B1 | 3/2001 | Parker |
| 6,205,056 B1 | 3/2001 | Pan et al. |
| 6,205,059 B1 | 3/2001 | Gutala et al. |
| 6,208,200 B1 | 3/2001 | Arakawa |
| 6,208,557 B1 | 3/2001 | Bergemont et al. |
| 6,214,666 B1 | 4/2001 | Mehta |
| 6,215,148 B1 | 4/2001 | Eitan |
| 6,215,697 B1 | 4/2001 | Lu et al. |
| 6,215,702 B1 | 4/2001 | Derhacobian et al. |
| 6,218,695 B1 | 4/2001 | Nachumovsky |
| 6,219,277 B1 | 4/2001 | Devin et al. |
| 6,219,290 B1 | 4/2001 | Chang et al. |
| 6,222,762 B1 | 4/2001 | Guterman et al. |
| 6,222,768 B1 | 4/2001 | Hollmer et al. |
| 6,233,180 B1 | 5/2001 | Eitan et al. |
| 6,240,032 B1 | 5/2001 | Fukumoto |
| 6,240,040 B1 | 5/2001 | Akaogi et al. |
| 6,246,555 B1 | 6/2001 | Tham |
| 6,252,442 B1 | 6/2001 | Malherbe |
| 6,252,799 B1 | 6/2001 | Liu et al. |
| 6,256,231 B1 | 7/2001 | Lavi et al. |
| 6,261,904 B1 | 7/2001 | Pham et al. |
| 6,265,268 B1 | 7/2001 | Halliyal et al. |
| 6,266,281 B1 | 7/2001 | Derhacobian et al. |
| 6,272,047 B1 | 8/2001 | Mihnea et al. |
| 6,275,414 B1 | 8/2001 | Randolph et al. |
| 6,281,545 B1 | 8/2001 | Liang et al. |
| 6,282,133 B1 | 8/2001 | Nakagawa et al. |
| 6,282,145 B1 | 8/2001 | Tran et al. |
| 6,285,246 B1 | 9/2001 | Basu |
| 6,285,574 B1 | 9/2001 | Eitan |
| 6,285,589 B1 | 9/2001 | Kajitani |
| 6,285,614 B1 | 9/2001 | Mulatti et al. |
| 6,292,394 B1 | 9/2001 | Cohen et al. |
| 6,297,096 B1 | 10/2001 | Boaz |
| 6,297,143 B1 | 10/2001 | Foote et al. |
| 6,297,974 B1 | 10/2001 | Ganesan et al. |
| 6,304,485 B1 | 10/2001 | Harari et al. |
| 6,307,784 B1 | 10/2001 | Hamilton et al. |
| 6,307,807 B1 | 10/2001 | Sakui et al. |
| 6,320,786 B1 | 11/2001 | Chang et al. |
| 6,324,094 B1 | 11/2001 | Chevallier |
| 6,326,265 B1 | 12/2001 | Liu et al. |
| 6,330,192 B1 | 12/2001 | Ohba et al. |
| 6,331,950 B1 | 12/2001 | Kuo et al. |
| 6,335,874 B1 | 1/2002 | Eitan |
| 6,335,990 B1 | 1/2002 | Chen et al. |
| 6,337,502 B1 | 1/2002 | Eitan et al. |
| 6,339,556 B1 | 1/2002 | Watanabe |
| 6,343,033 B1 | 1/2002 | Parker |
| 6,344,959 B1 | 2/2002 | Milazzo |
| 6,346,442 B1 | 2/2002 | Aloni et al. |
| 6,348,381 B1 | 2/2002 | Jong |
| 6,348,711 B1 | 2/2002 | Eitan |
| 6,351,415 B1 | 2/2002 | Kushnarenko |
| 6,353,356 B1 | 3/2002 | Liu |
| 6,353,554 B1 | 3/2002 | Banks |
| 6,353,555 B1 | 3/2002 | Jeong |
| 6,356,062 B1 | 3/2002 | Elmhurst et al. |
| 6,356,469 B1 | 3/2002 | Roohparvar et al. |
| 6,359,501 B2 | 3/2002 | Lin et al. |
| 6,374,337 B1 | 4/2002 | Estakhri |
| 6,385,086 B1 | 5/2002 | Mihara et al. |
| 6,396,741 B1 | 5/2002 | Bloom et al. |
| 6,400,209 B1 | 6/2002 | Matsuyama et al. |
| 6,400,607 B1 | 6/2002 | Pasotti et al. |
| 6,407,537 B2 | 6/2002 | Antheunis |
| 6,410,388 B1 | 6/2002 | Kluth et al. |
| 6,417,081 B1 | 7/2002 | Thurgate |
| 6,418,506 B1 | 7/2002 | Pashley et al. |
| 6,426,898 B1 | 7/2002 | Mihnea et al. |
| 6,429,063 B1 | 8/2002 | Eitan |
| 6,433,624 B1 | 8/2002 | Grossnikle et al. |
| 6,436,766 B1 | 8/2002 | Rangarajan et al. |
| 6,436,768 B1 | 8/2002 | Yang et al. |
| 6,438,031 B1 | 8/2002 | Fastow |
| 6,438,035 B2 | 8/2002 | Yamamoto et al. |
| 6,440,797 B1 | 8/2002 | Wu et al. |
| 6,442,074 B1 | 8/2002 | Hamilton et al. |
| 6,445,030 B1 | 9/2002 | Wu et al. |
| 6,449,188 B1 | 9/2002 | Fastow |
| 6,449,190 B1 | 9/2002 | Bill |
| 6,452,438 B1 | 9/2002 | Li |
| 6,455,896 B1 | 9/2002 | Chou et al. |
| 6,456,528 B1 | 9/2002 | Chen |
| 6,456,533 B1 | 9/2002 | Hamilton et al. |
| 6,458,656 B1 | 10/2002 | Park et al. |
| 6,458,677 B1 | 10/2002 | Hopper et al. |
| 6,469,929 B1 | 10/2002 | Kushnarenko et al. |
| 6,469,935 B2 | 10/2002 | Hayashi |
| 6,472,706 B2 | 10/2002 | Widdershoven et al. |
| 6,477,085 B1 | 11/2002 | Kuo |
| 6,490,204 B2 | 12/2002 | Bloom et al. |
| 6,496,414 B2 | 12/2002 | Kasa et al. |
| 6,504,756 B2 | 1/2003 | Gonzalez et al. |
| 6,510,082 B1 | 1/2003 | Le et al. |
| 6,512,701 B1 | 1/2003 | Hamilton et al. |
| 6,519,180 B2 | 2/2003 | Tran et al. |
| 6,519,182 B1 | 2/2003 | Derhacobian et al. |
| 6,522,585 B2 | 2/2003 | Pasternak |
| 6,525,969 B1 | 2/2003 | Kurihara et al. |
| 6,528,390 B2 | 3/2003 | Komori et al. |
| 6,529,412 B1 | 3/2003 | Chen et al. |
| 6,532,173 B2 | 3/2003 | Lioka et al. |
| 6,535,020 B1 | 3/2003 | Yin |
| 6,535,434 B2 | 3/2003 | Maayan et al. |
| 6,537,881 B1 | 3/2003 | Rangarajan et al. |
| 6,538,270 B1 | 3/2003 | Randolph et al. |
| 6,541,816 B2 | 4/2003 | Ramsbey et al. |
| 6,552,387 B1 | 4/2003 | Eitan |
| 6,555,436 B2 | 4/2003 | Ramsbey et al. |
| 6,559,500 B2 | 5/2003 | Torii |
| 6,562,683 B1 | 5/2003 | Wang et al. |
| 6,566,194 B1 | 5/2003 | Ramsbey et al. |
| 6,566,699 B2 | 5/2003 | Eitan |
| 6,567,303 B1 | 5/2003 | Hamilton et al. |
| 6,567,312 B1 | 5/2003 | Torii et al. |
| 6,570,211 B1 | 5/2003 | He et al. |
| 6,574,139 B2 | 6/2003 | Kurihara |
| 6,577,514 B2 | 6/2003 | Shor et al. |
| 6,577,532 B1 | 6/2003 | Chevallier |
| 6,577,547 B2 | 6/2003 | Ukon |
| 6,583,005 B2 | 6/2003 | Hashimoto et al. |
| 6,583,479 B1 | 6/2003 | Fastow et al. |
| 6,584,017 B2 | 6/2003 | Maayan et al. |
| 6,590,811 B1 | 7/2003 | Hamilton et al. |
| 6,593,606 B1 | 7/2003 | Randolph et al. |
| 6,594,181 B1 | 7/2003 | Yamada |
| 6,608,526 B1 | 8/2003 | Sauer |
| 6,608,905 B1 | 8/2003 | Muza et al. |
| 6,614,052 B1 | 9/2003 | Zhang |
| 6,614,295 B2 | 9/2003 | Tsuchi |
| 6,614,686 B1 | 9/2003 | Kawamura |
| 6,614,692 B2 | 9/2003 | Maayan et al. |

| | | |
|---|---|---|
| 6,617,179 B1 | 9/2003 | Kim |
| 6,617,215 B1 | 9/2003 | Halliyal et al. |
| 6,618,290 B1 | 9/2003 | Wang et al. |
| 6,624,672 B2 | 9/2003 | Confaloneri et al. |
| 6,627,555 B2 | 9/2003 | Eitan et al. |
| 6,630,384 B1 | 10/2003 | Sun et al. |
| 6,633,496 B2 | 10/2003 | Maayan et al. |
| 6,633,499 B1 | 10/2003 | Eitan et al. |
| 6,633,956 B1 | 10/2003 | Mitani |
| 6,636,440 B2 | 10/2003 | Maayan et al. |
| 6,639,271 B1 | 10/2003 | Zheng et al. |
| 6,639,837 B2 | 10/2003 | Takano et al. |
| 6,639,844 B1 | 10/2003 | Liu et al. |
| 6,639,849 B2 | 10/2003 | Takahashi et al. |
| 6,642,148 B1 | 11/2003 | Ghandehari et al. |
| 6,642,573 B1 | 11/2003 | Halliyal et al. |
| 6,642,586 B2 | 11/2003 | Takahashi |
| 6,643,170 B2 | 11/2003 | Huang et al. |
| 6,643,177 B1 | 11/2003 | Le et al. |
| 6,643,178 B2 | 11/2003 | Kurihara |
| 6,643,181 B2 | 11/2003 | Sofer et al. |
| 6,645,801 B1 | 11/2003 | Ramsbey et al. |
| 6,649,972 B2 | 11/2003 | Eitan |
| 6,650,568 B2 | 11/2003 | Iijima |
| 6,653,190 B1 | 11/2003 | Yang et al. |
| 6,653,191 B1 | 11/2003 | Yang et al. |
| 6,654,296 B2 | 11/2003 | Jang et al. |
| 6,664,588 B2 | 12/2003 | Eitan |
| 6,665,769 B2 | 12/2003 | Cohen et al. |
| 6,670,241 B1 | 12/2003 | Kamal et al. |
| 6,670,669 B1 | 12/2003 | Kawamura |
| 6,674,138 B1 | 1/2004 | Halliyal et al. |
| 6,677,805 B2 | 1/2004 | Shor et al. |
| 6,680,509 B1 | 1/2004 | Wu et al. |
| 6,686,242 B2 | 2/2004 | Willer et al. |
| 6,690,602 B1 | 2/2004 | Le et al. |
| 6,693,483 B2 | 2/2004 | Deml et al. |
| 6,700,818 B2 | 3/2004 | Shappir et al. |
| 6,717,207 B2 | 4/2004 | Kato |
| 6,723,518 B2 | 4/2004 | Papsidero et al. |
| 6,731,542 B1 | 5/2004 | Le et al. |
| 6,738,289 B2 | 5/2004 | Gongwer et al. |
| 6,744,692 B2 | 6/2004 | Shiota et al. |
| 6,765,259 B2 | 7/2004 | Kim |
| 6,768,165 B1 | 7/2004 | Eitan |
| 6,781,876 B2 | 8/2004 | Forbes et al. |
| 6,788,579 B2 | 9/2004 | Gregori et al. |
| 6,791,396 B2 | 9/2004 | Shor et al. |
| 6,794,249 B2 | 9/2004 | Palm et al. |
| 6,794,280 B2 | 9/2004 | Chang |
| 6,818,956 B2 | 11/2004 | Kuo et al. |
| 6,829,172 B2 | 12/2004 | Bloom et al. |
| 6,831,872 B2 | 12/2004 | Matsuoka |
| 6,836,431 B2 | 12/2004 | Chang |
| 6,859,028 B2 | 2/2005 | Toner |
| 6,870,772 B1 | 3/2005 | Nitta et al. |
| 6,871,258 B2 | 3/2005 | Micheloni et al. |
| 6,885,585 B2 | 4/2005 | Maayan et al. |
| 6,885,590 B1 | 4/2005 | Zheng et al. |
| 6,906,357 B1 | 6/2005 | Vashchenko et al. |
| 6,912,160 B2 | 6/2005 | Yamada |
| 6,917,544 B2 | 7/2005 | Maayan et al. |
| 6,928,001 B2 | 8/2005 | Avni et al. |
| 6,937,523 B2 | 8/2005 | Eshel |
| 6,967,872 B2 | 11/2005 | Quader et al. |
| 6,990,001 B2 | 1/2006 | Ma et al. |
| 6,996,692 B2 | 2/2006 | Kouno |
| 7,079,420 B2 | 7/2006 | Shappir et al. |
| 2001/0006477 A1 | 7/2001 | Banks |
| 2002/0004878 A1 | 1/2002 | Norman |
| 2002/0004921 A1 | 1/2002 | Muranaka et al. |
| 2002/0064911 A1 | 5/2002 | Eitan |
| 2002/0132436 A1 | 9/2002 | Eliyahu et al. |
| 2002/0140109 A1 | 10/2002 | Keshavarzi et al. |
| 2002/0145465 A1 | 10/2002 | Shor et al. |
| 2002/0191465 A1 | 12/2002 | Maayan et al. |
| 2002/0199065 A1 | 12/2002 | Subramoney et al. |
| 2003/0001213 A1 | 1/2003 | Lai |
| 2003/0021155 A1 | 1/2003 | Yachareni et al. |
| 2003/0072192 A1 | 4/2003 | Bloom et al. |
| 2003/0076710 A1 | 4/2003 | Sofer et al. |
| 2003/0117841 A1 | 6/2003 | Yamashita |
| 2003/0131186 A1 | 7/2003 | Buhr |
| 2003/0134476 A1 | 7/2003 | Roizin et al. |
| 2003/0142544 A1 | 7/2003 | Maayan et al. |
| 2003/0145176 A1 | 7/2003 | Dvir et al. |
| 2003/0145188 A1 | 7/2003 | Cohen et al. |
| 2003/0155659 A1 | 8/2003 | Verma et al. |
| 2003/0190786 A1 | 10/2003 | Ramsbey et al. |
| 2003/0197221 A1 | 10/2003 | Shinozaki et al. |
| 2003/0202411 A1 | 10/2003 | Yamada |
| 2003/0206435 A1 | 11/2003 | Takahashi |
| 2003/0208663 A1 | 11/2003 | Van Buskirk et al. |
| 2003/0209767 A1 | 11/2003 | Takahashi et al. |
| 2003/0214844 A1 | 11/2003 | Iijima |
| 2003/0218207 A1 | 11/2003 | Hashimoto et al. |
| 2003/0218913 A1 | 11/2003 | Le et al. |
| 2003/0222303 A1 | 12/2003 | Fukuda et al. |
| 2003/0227796 A1 | 12/2003 | Miki et al. |
| 2004/0007730 A1 | 1/2004 | Chou et al. |
| 2004/0012993 A1 | 1/2004 | Kurihara |
| 2004/0013000 A1 | 1/2004 | Torii |
| 2004/0014280 A1 | 1/2004 | Willer et al. |
| 2004/0014290 A1 | 1/2004 | Yang et al. |
| 2004/0021172 A1 | 2/2004 | Zheng et al. |
| 2004/0027858 A1 | 2/2004 | Takahashi et al. |
| 2004/0151034 A1 | 8/2004 | Shor et al. |
| 2004/0153621 A1 | 8/2004 | Polansky et al. |
| 2004/0157393 A1 | 8/2004 | Hwang |
| 2004/0222437 A1 | 11/2004 | Avni et al. |
| 2005/0058005 A1 | 3/2005 | Shappir et al. |
| 2005/0117395 A1 | 6/2005 | Maayan et al. |
| 2005/0117601 A1 | 6/2005 | Anderson et al. |
| 2005/0140405 A1 | 6/2005 | Do et al. |
| 2005/0213593 A1 | 9/2005 | Anderson et al. |
| 2005/0232024 A1 | 10/2005 | Atir et al. |
| 2006/0084219 A1 | 4/2006 | Lusky et al. |
| 2006/0126382 A1 | 6/2006 | Maayan et al. |
| 2006/0126383 A1 | 6/2006 | Shappir et al. |

FOREIGN PATENT DOCUMENTS

| | | |
|---|---|---|
| EP | 0751560 | 6/1995 |
| EP | 0693781 | 1/1996 |
| EP | 0 822 557 | 2/1998 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1 091 418 | 4/2001 |
| EP | 1126469 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |

| | | |
|---|---|---|
| JP | 04-291962 | 10/1992 |
| JP | 05021758 | 1/1993 |
| JP | 05-326893 | 12/1993 |
| JP | 06151833 | 5/1994 |
| JP | 06-232416 | 8/1994 |
| JP | 07193151 | 7/1995 |
| JP | 08-106791 | 4/1996 |
| JP | 08-297988 | 11/1996 |
| JP | 09-017981 | 1/1997 |
| JP | 09162314 | 6/1997 |
| JP | 10-106276 | 4/1998 |
| JP | 10 334676 | 12/1998 |
| JP | 11-162182 | 6/1999 |
| JP | 11-354758 | 12/1999 |
| JP | 2001-085646 | 3/2001 |
| JP | 2001-118392 | 4/2001 |
| JP | 2001-156189 | 6/2001 |
| JP | 2002-216488 | 8/2002 |
| JP | 3358663 | 10/2002 |
| WO | WO 81/00790 | 3/1981 |
| WO | WO 96/15553 | 5/1996 |
| WO | WO 96/25741 | 8/1996 |
| WO | WO 98/03977 | 1/1998 |
| WO | WO 99/31670 | 6/1999 |
| WO | WO 99/57728 | 11/1999 |
| WO | WO 00/46808 | 8/2000 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/032393 | 4/2003 |
| WO | WO 03/036651 | 5/2003 |
| WO | WO 03/054964 | 7/2003 |
| WO | WO 03/063167 | 7/2003 |
| WO | WO 03/063168 | 7/2003 |
| WO | WO 03/079370 | 9/2003 |
| WO | WO 03/079446 | 9/2003 |
| WO | WO 03/083916 | 10/2003 |
| WO | WO 03/088258 | 10/2003 |
| WO | WO 03/088259 | 10/2003 |
| WO | WO 03/088260 | 10/2003 |
| WO | WO 03/088261 | 10/2003 |
| WO | WO 03/088353 | 10/2003 |
| WO | WO 03/100790 | 12/2003 |

OTHER PUBLICATIONS

Bude et al., Secondary Electron Flash—a High Performance, Low Power Flash Technology for 0.35 um and below, IEDM, 1997, 279-282.

Bude et al., Modeling Nonequilibrium Hot Carrier Device Effects, Conference of Insulator Specialists of Europe, Jun. 1997, Sweden.

Jung et al., IEEE Journal of Solid-State Circuits, Nov. 1996, 1575-1583, vol. 31, No. 11.

Campardo et al., IEEE Journal of Solid-State Circuits, Nov. 2000, 1655-1667, vol. 35, No. 11.

Lin et al., Novel Source-Controlled Self-Verified Programming for Multilevel EEPROM's, IEEE Transactions on Electron Devices, Jun. 2000, 1166-1174, vol. 47, No. 6.

Chan et al., A True Single-Transistor Oxide-Nitride-Oxide EEPROM Device, IEEE Electron Device Letters, Mar. 1987, vol. EDL-8, No. 3.

Eitan et al., "Hot-Electron Injection into the Oxide in n-Channel MOS Devices", IEEE Transactions on Electron Devices, vol. ED-28, No. 3, pp. 328-370, Mar. 1981.

Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.

Tanaka et al., "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373

Ma et al., A Dual-bit Split-Gate EEPROM (DSG) Cell in Contactless Array for Single-Vcc High Density Flash Memories, IEEE, 1994, 57-60.

Oshima et al., Process and Device Technologies for 16Mbit EPROMs with Large-Tilt-Angle Implanted P-Pocket Cell, IEEE, Dec. 1990, Ch. 2865-4/90/0000-0095, pp. 5 2 1-5 2 4, San Francisco, California.

Lee, A new approach for the floating-gate MOS nonvolatile memory, Applied Physics Letters, Oct. 1977, 475-476, vol. 31, No. 7, American Institute of Physics.

Glasser et al., MOS Device Electronics, The Design and Analysis of VLSI Circuits, Chapter 2, 67-163, 1998, Addison-Wesley Publishing Company.

Bhattacharyya et al., FET Gate Structure for Nonvolatile N-Channel Read-Mostly Memory Device, IBM Technical Disclosure Bulletin, Nov. 1975, 1768, vol. 18, No. 6.

Ricco et al., Nonvolatile Multilevel Memories for Digital Applications, Dec. 1998, 2399-2421, vol. 86, No. 12, Institute of Electrical and Electronics Engineers, Inc., Martin, Improved Circuits for the Realization of Switched-Capacitor Filters, IEEE Transactions on Circuits and Systems, Apr. 1980, 237-244, vol. CAS-27.

Tseng et al., "Thin CVD Stacked Gate Dielectric for ULSI Technology", IEEE, pp. 321-214; 1993, 13.1.1-13.1.4.

Pickar, Ion Implementation is Silicon—Physics, Processing, and Microelectronic Devices, Applied Solid State Science, 1975, 151-241, vol. 5, Academic Press.

2 Bit/Cell EEPROM Cell Using Band-To-Band Tunneling for Data Read-Out, IBM Technical Disclosure Bulletin, 1992, 136-140, vol. 35 No. 4B.

Umezawa, et al., A 5-V-Only Operation 0.6-µm Flash EEPROM with Row Decoder Scheme in Triple-Well Structure, IEEE Journal of Solid-State Circuits, 1992, 1540, vol. 27.

Mitchell, et al., A new self-aligned planar array cell for ultra high density EPROMS, 1987.

Esquivel, et al, High Density Contactless, Self Aligned EPROM Cell Array Technology, 1986.

Johns, Martin, Analog Integrated Circuit Designl, Jun. 1, 1997, Chapter 10, John Wiley and Sons Inc.

Allen, et al., CMOS Analog Circuit Design, 2002, 259pages, Oxford University Press.

Klinke, et al., A very-high-slew-rate CMOS operational amplifier, IEEE Journal of Solid-State Circuits, 1989, 744-746, 24 vol.

Shor, et al, paper WA2.04.01—Self regulated Four phased charge pump with boosted wells, ISCAS 2002.

Fotouhi, An efficient CMOS line driver for 1.544-Mb/s T1 and 2.048-Mb/s E1 applications, IEEE Journal of Solid-State Circuits, 2003, 226-236pages, 38vol.

P-N Junction Diode, Physics of semiconductor devices, 1981, ch. 2, "A Wiley-Interscience Publication", John Wiley & Sons Publishers.

Chang, Non Volatile Semiconductor Memory Devices, Proceedings of the IEEE, 64 vol., No. 7 , pp. 1039-1059; Jul. 1976.

Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.

4 Bits of Digital Fit in a Single Cell, Technology Newsletter, Electronic Design, Apr. 1, 1996.

M. Specht et al, Novel Dual Bit Tri- Gate Charge Trapping Memory Devices, IEEE Electron Device Letters, vol. 25, No. 12, Dec. 2004, pp. 810-812.

"Design Considerations in Scaled SONOS Nonvolatile Memory Devices" Bu, Jiankang et al. , Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.

"SONOS Nonvolatile Semiconductor Memories for Space and Military Applications", Adams et al., Symposium, 2000. http://klabs.org/richcontent/MemoryContent/nvmt_symp/nvmts_2000/papers/adams_d.pdf.

"Philips Research—Technologies—Embedded Nonvolatile Memories" http://research.philips.com/technologies/ics/nvmemories/index.html.

"Semiconductor Memory: Non-Volatile Memory (NVM)", National University of Singapore, Department of Electrical and Computer Engineering: http://ece.nus.edu.sg/stfpage/elezhucx/myweb/NVM.pdf.

"Saifun Non-Volatile Memory Technology", 1st Edition, 2005, published and written by Saifun Semiconductors Ltd. 1110 pgs.

U.S. Appl. No. 08/902,890, filed Jul. 30, 1997, Eitan.
U.S. Appl. No. 11/489,327, filed Jul. 18, 2006, Eitan et al.
U.S. Appl. No. 11/440,624, filed May 24, 2006, Lusky et al.

* cited by examiner

APPARATUS AND METHODS FOR MULTI-LEVEL SENSING IN A MEMORY ARRAY

RELATED APPLICATIONS

This application is a continuation of U.S. patent application Ser. No. 10/810,683, now U.S. Pat. No. 7,142,464, filed Mar. 29, 2004.

FIELD OF THE INVENTION

The present invention relates generally to semiconductor memories, and more particularly to devices for multi-level sensing of signals received from a memory cell.

BACKGROUND OF THE INVENTION

Memory devices, such as random access memory (RAM), read-only memory (ROM), non-volatile memory (NVM) and the like, are well known in the art. A memory device includes an array of memory cells and peripheral supporting systems for managing, programming/erasing and data retrieval operations.

These devices provide an indication of the data, which is stored, therein by providing an output electrical signal. A device called a sense amplifier (SA) is used for detecting the signal and determining the logical content thereof.

In general, sense amplifiers determine the logical value stored in a cell by comparing the output of the cell (voltage or current) with a threshold level (voltage or current). If the output is above the threshold, the cell is determined to be erased (with a logical value of 1) and if the output is below the threshold, the cell is determined to be programmed (with a logical value of 0).

The threshold level is typically set as a level between the expected erased and programmed levels, which is high enough (or sufficiently far from both expected levels) so that noise on the output will not cause false results.

An example of a prior art sense amplifier circuit is shown in FIG. 1. This sense amplifier circuit is similar to a sense amplifier described in U.S. Pat. No. 6,469,929 to Alexander Kushnarenko and Oleg Dadashev, entitled "Structure and method for high speed sensing of memory array".

FIG. 1 illustrates a prior art sensing system for a memory array 110, which includes a plurality of memory cells arranged in any number of rows and columns. For purposes of illustration, assume that a memory cell 111 is to be read (i.e. sensed). Memory cell 111 has its drain and source terminals coupled to array bit lines BN and BN+1 and its control terminal coupled to a word line W1. Memory cell 111 is selectively coupled to a system bit line BL using a column decoder 104 (for selecting the array bit lines) and a row decoder 103 (for selecting the word lines). The system bit line BL may include an associated parasitic capacitance CBL that is proportional to the number of memory cells coupled to the selected array bit line.

Similarly for a memory array 112, a memory cell 113 has its drain and source terminals coupled to array bit lines BM and BM+1 and its control terminal coupled to a word line W1. Memory cell 113 is selectively coupled to a system bit line BL_REF using a column decoder 105 (for selecting the array bit lines) and a tow decoder 106 (for selecting the word lines). The system bit line BL may include an associated parasitic capacitance CREF_BL that is proportional to the number of memory cells coupled to the selected array bit line.

To read (i.e. sense) the state of memory cell 111 in memory array 110, the array bit line BN is coupled to the system bit line BL, the array bit line BN+1 is coupled to a predetermined voltage (e.g. ground), and the word line W1 is coupled to a read voltage (e.g., 3 volts). The operation of decoders 103 and 104 to provide the above-described coupling is well known and therefore not described in detail herein.

The previous paragraph and the following description hold true, mutatis mutandis, for memory cell 113 in memory array 112, that is, the circuitry on the right side of FIG. 1.

To ensure that a sense amplifier 145 correctly senses the logic state of memory cell 111, the system bit line BL may be charged to a predetermined level (e.g., approximately 2V) before the sensing of memory cell 111. The optimal charging of the system bit line BL may facilitate a quick transition to the predetermined voltage without overshooting this predetermined voltage. This charging operation may be initiated using a charge initiation device P2 and advantageously controlled using a control unit 120 (control unit 121 for the right side of FIG. 1) that quickly and efficiently charges the system bit line BL.

Specifically, to initiate a charge operation, an active signal CHARGE turns on charge initiation device P2 (P7 for the right side of FIG. 1). Charge initiation device P2 may comprise a PMOS (p-channel metal oxide semiconductor) transistor, wherein the active signal CHARGE is a logic 0. When conducting, charge initiation device P2 transfers a pull-up signal provided by the sense amplifier 145 (explained in detail below) to control unit 120.

Control unit 120 may comprise a static clamp including an NMOS (n-channel metal oxide semiconductor) transistor N1 (N2 for the right side of FIG. 1) and a dynamic clamp including a PMOS transistor P1 (P8 for the right side of FIG. 1). The transistor N1 may have its drain connected to charge initiation device P2 and its source connected to system bit line BL. Transistor N1 receives a bias voltage VB on its gate. Bias voltage VB is the gate bias voltage for transistor N1 as defined by:

$$VTN < VB < VBLD + VTN$$

wherein VBLD is the desired voltage on bit line BL and VTN is the threshold voltage of the n-type transistor (e.g., 0.6V). In this manner, transistor N1 charges bit line BL very quickly to VB-VTN. At this point, transistor N1 transitions to non-conducting, i.e. the static clamp deactivates, and the dynamic clamp is activated (as explained below).

The dynamic clamp of control unit 120 may include PMOS transistor P1 having its source connected to charge initiation device P2 (also the drain of transistor N1) and its drain coupled to bit line BL (also the source of transistor N1). The dynamic clamp further comprises a comparator C1 (C2 for the right side of FIG. 1), which compares a reference voltage BIAS and the bit line voltage BL and then outputs a signal VG representative of that comparison. Specifically, comparator C1 outputs a low signal VG if VBL is less than BIAS and outputs a high signal VG if VBL is greater than BIAS (or if comparator C1 is disabled). The reference voltage BIAS may be approximately equal to the desired bit line voltage VBLD on the system bit line BL. The transistor P1 receives the signal VG on its control gate.

Sense amplifier 145 may include first stages 130 and 131 and second stage 140. The first stage 130 includes a pull-up device N4, which is an NMOS transistor having its drain and gate connected to a supply voltage VDD and its source connected to charge initiation device P2, and a current sensing device P3, which is a PMOS transistor having its drain and gate connected to charge initiation device P2 and its source connected to the supply voltage VDD. Note that in this configuration, current sensing device P3 advantageously functions as a diode, which is explained in further detail below.

The first stage 131 has an identical configuration to first stage 130. Specifically, first stage 131 includes a pull-up device N3, which is an NMOS transistor having its drain and gate connected to a supply voltage VDD and its source connected to charge initiation device P7, and a current sensing device P6, which is a PMOS transistor having its drain and gate connected to charge initiation device P7 and its source connected to the supply voltage VDD.

After charge initiation device P2 (P7 for the right side of FIG. 1) is activated, both pull-up transistor N4 (N3) and current sensing device P3 (P6) conduct strongly. During the charge operation, the system bit line BL initially receives a pull-up voltage of VDD-VTN via pull-up transistor N4 (N3). Then, via current sensing device P3 (P6), the voltage on the system bit line BL increases to VDD-VTP, wherein VTP is the threshold voltage of the PMOS transistor Note that the voltage VDD-VTP is substantially equal to the desired system bit line voltage VBLD. At this point, this increased voltage on the system bit line BL turns off pull-up transistor N4 (N3). Because current sensing device P3 (P6) is connected as a diode, only current IBL (IBL_REF) is detected. Therefore, depending on the state of the sensed memory cell, a predetermined current can flow through current sensing device P3 (P6).

Current sensing devices P3 and P6 in first stages 130 and 131, respectively, have current mirrors provided in second stage 140. Specifically, the current IBL through current sensing device P3 is reflected in the current I1 through a PMOS transistor P4, whereas the current IBL_REF through current sensing device P6 is reflected in the current I2 through a PMOS transistor P5. The ratio of the currents through current sensing device P3 and PMOS transistor P4 defines the gain of first stage 130, whereas the ratio of the current through current sensing device P6 and PMOS transistor P6 defines the gain of first stage 131. A latch circuit 141 (e.g., amplifier block) may amplify and compare currents I1 and I2.

The sense amplifier 145 may not operate properly unless the VDD supply voltage is greater than a minimum voltage VDD_MIN, which is defined as follows:

$$V_{DD\_MIN} = V_{DIODE\_MAX} + V_{BL\_MIN} + V_{P1/P8} + V_{P2/P7} \quad (1)$$

In equation (1), VDIODE_MAX is the maximum voltage drop across PMOS transistor P3 or PMOS transistor P6, VBL_MIN is the minimum acceptable bit line voltage for the non-volatile memory technology, VP1/P8 is the drain-to-source voltage drop of PMOS transistor P1 (or PMOS transistor P8), and VP2/P7 equal to the drain-to-source voltage drop on PMOS transistor P2 (or PMOS transistor P7).

For example, if VDIODE_MAX is equal to 1.0 Volt, VBL_MIN is equal to 1.8 Volts, and VP1/P8 and VP2/P7 are equal to 0.05 Volts, then the minimum supply voltage VDD_MIN is equal to 2.9 Volts (1.8V+1V+0.05V+0.05V). In such a case, memory device 100 would not be usable in applications that use a VDD supply voltage lower than 2.9 Volts.

In addition, sense amplifier first stages 130 and 131 are sensitive to noise in the VDD supply voltage. If, during a read operation, the VDD supply voltage rises to an increased voltage of VDD_OVERSHOOT, then the voltages VSA1 and VSA2 on the drains of PMOS transistors P3 and P6 rise to a level approximately equal to VDD_OVERSHOOT minus a diode voltage drop. If the VDD supply voltage then falls to a reduced voltage of VDD_UNDERSHOOT, then transistors P3 and P6 may be turned off. At this time, sense amplifier first stages 130 and 131 cannot operate until the cell currents IBL and IBL_REF discharge the voltages VSA1 and VSA2. If the cell current IBL is low, then sense amplifier first stage 130 will remain turned off until the end of the read operation, thereby causing the read operation to fail.

Accordingly, it is desirable to provide a sensing system that can accommodate low supply voltages and tolerate supply voltage fluctuations.

SUMMARY OF THE INVENTION

The present invention seeks to provide apparatus and methods for multi-level sensing in a memory arrays as is described more in detail hereinbelow.

The present invention enables multilevel sensing at a lower voltage operation. The multi-level sensing may not be sensitive to Vdd noise (over/under shoots).

There is thus provided in accordance with an embodiment of the invention a method for sensing a signal received from an array cell within a memory array, the method including the steps of generating an analog voltage Vddr proportional to a current of a selected array cell of the memory array, and comparing the analog voltage Vddr with a reference analog voltage Vcomp to generate an output digital signal.

In accordance with an embodiment of the invention the method further includes providing a reference unit with a reference cell having a similar structure and a similar current path therethrough to that of the array cell, and providing a drain driver for driving drain bit lines of the memory array and reference drain bit lines of the reference unit, wherein the drain driver generates the analog voltage Vddr.

Further in accordance with an embodiment of the invention if the analog voltage Vddr is greater than the reference analog voltage Vcomp then a low output digital signal is output, and if the analog voltage Vddr is not greater than the reference analog voltage Vcomp then a high output digital signal is output.

In accordance with an embodiment of the invention the method further includes discharging the memory array and the reference unit, charging the memory array and the reference unit so as to generate an array cell signal and a reference signal, respectively, and a timing signal, generating a read signal when the timing signal reaches a predefined voltage level, and generating a sensing signal from the difference of the cell and reference signals once the read signal is generated.

There is also provided in accordance with an embodiment of the invention a method for sensing a memory cell, the method including the steps of transforming a signal from a memory cell to a time delay, and sensing the memory cell by comparing the time delay to a time delay of a reference cell. The time delay may include a digital signal delay. At least one of rise and fall times of the time delays may be compared. Transforming the signal from the memory cell to the time delay may include generating an analog voltage Vddr proportional to a current of the memory cell. The analog voltage Vddr may be compared with a reference analog voltage Vcomp to generate an output digital signal.

There is also provided in accordance with an embodiment of the invention apparatus for sensing a signal received from an array cell within a memory array, the apparatus including a drain driver adapted to generate an analog voltage Vddr proportional to a current of a selected array cell of the memory array, and a comparator adapted to compare the analog voltage Vddr with a reference analog voltage Vcomp to generate an output digital signal.

In accordance with an embodiment of the invention a reference unit may be provided with a reference cell having a similar structure and a similar current path therethrough to that of the array cell, wherein the drain driver is adapted to drive drain bit lines of the memory array and reference drain bit lines of the reference unit. A data unit may receive the output digital signal.

Further in accordance with an embodiment of the invention the comparator compares the analog voltage Vddr with a reference analog voltage Vcomp and generates the output digital signal in the following manner: if the analog voltage Vddr is greater than the reference analog voltage Vcomp then a low output digital signal is output, and if the analog voltage Vddr is not greater than the reference analog voltage Vcomp then a high output digital signal is output.

There is also provided in accordance with an embodiment of the invention apparatus for sensing a memory cell including a driver adapted to transform a signal from a memory cell to a time delay, and a comparator adapted to compare the time delay to a time delay of a reference cell.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
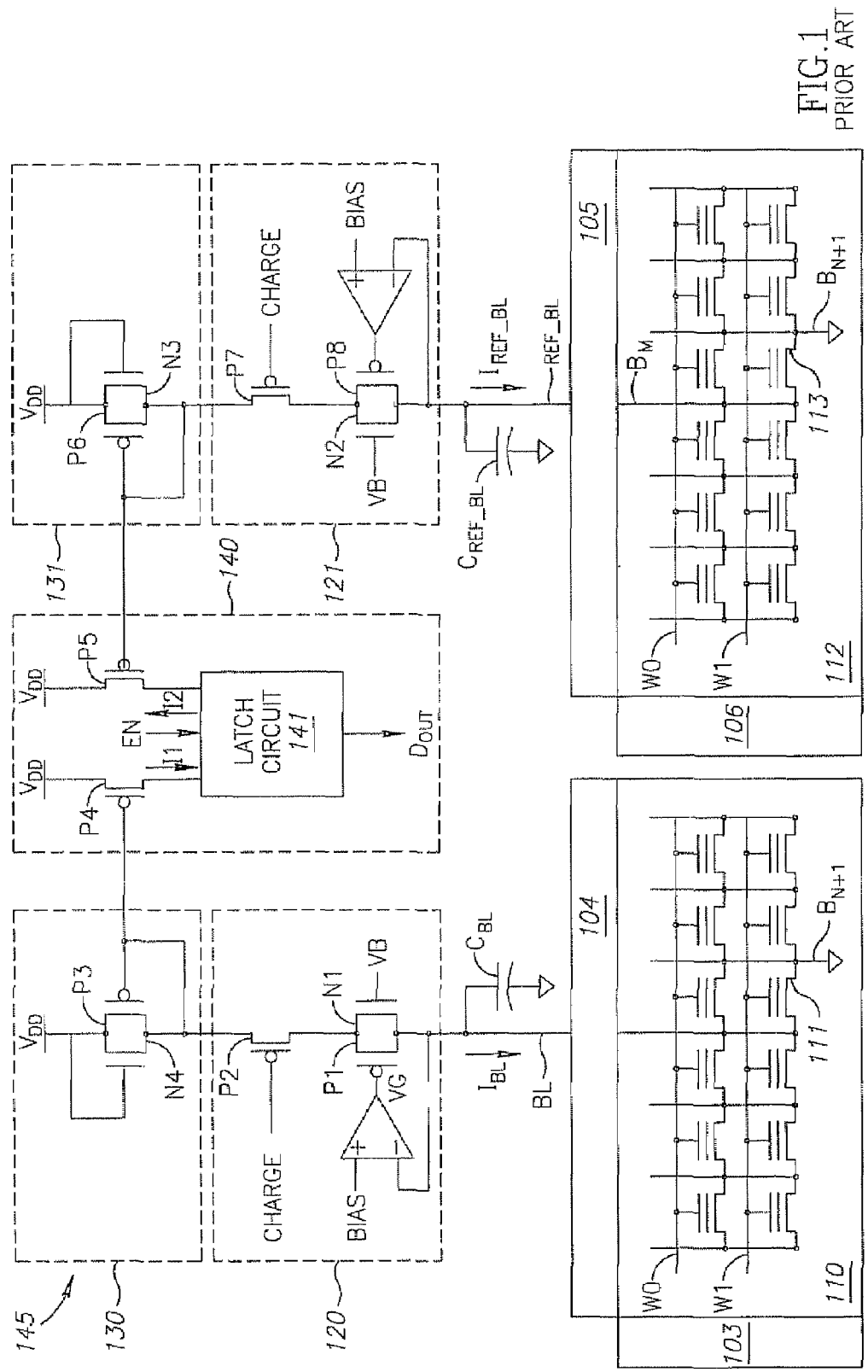
FIG. 1 is a simplified illustration of a prior art sensing system for a memory array, which includes a plurality of memory cells arranged in any number of rows and columns.
Figure 2:
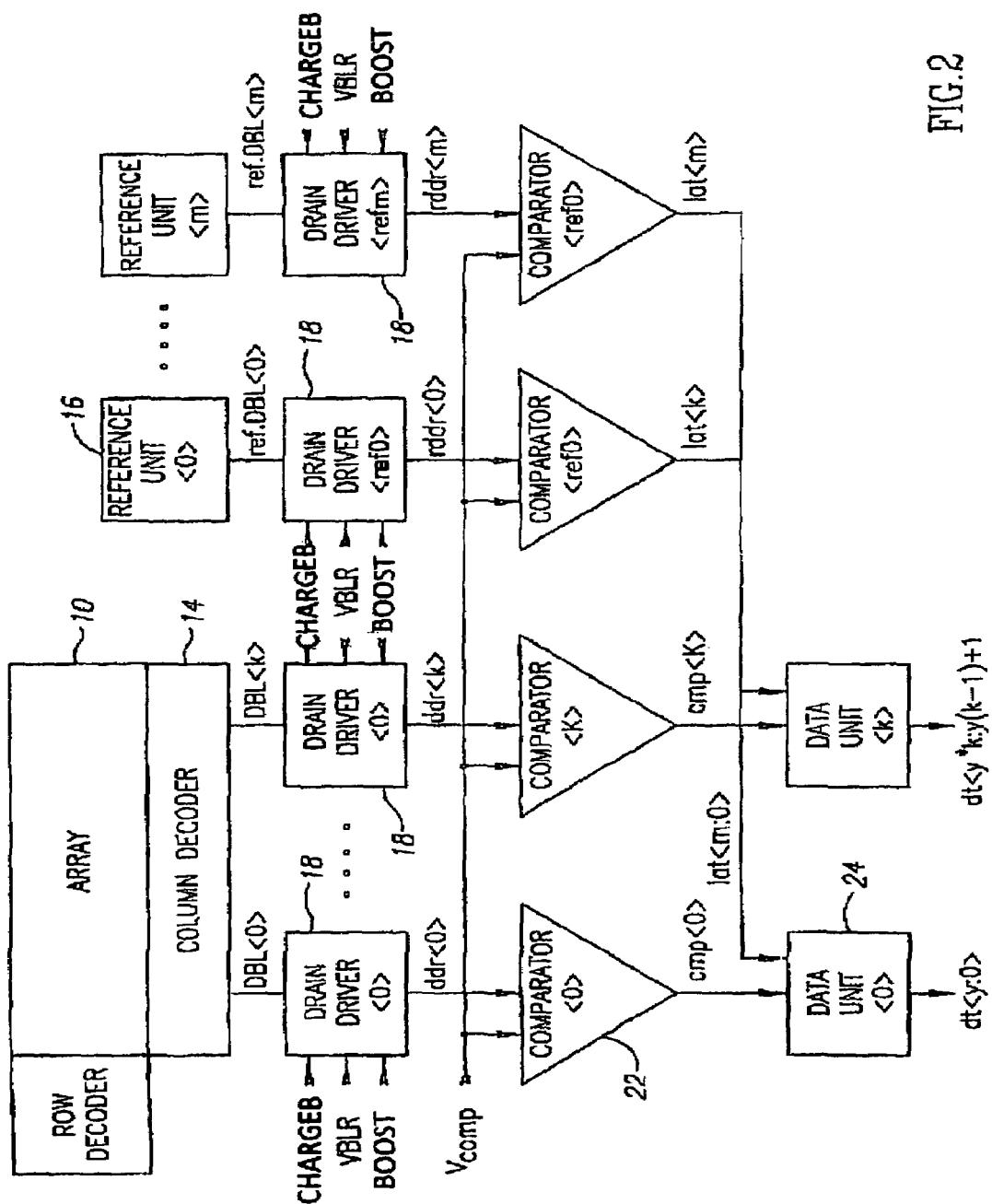
FIG. 2 is a simplified block diagram of a memory sensing system, constructed and operative in accordance with an embodiment of the present invention.
Figure 3:
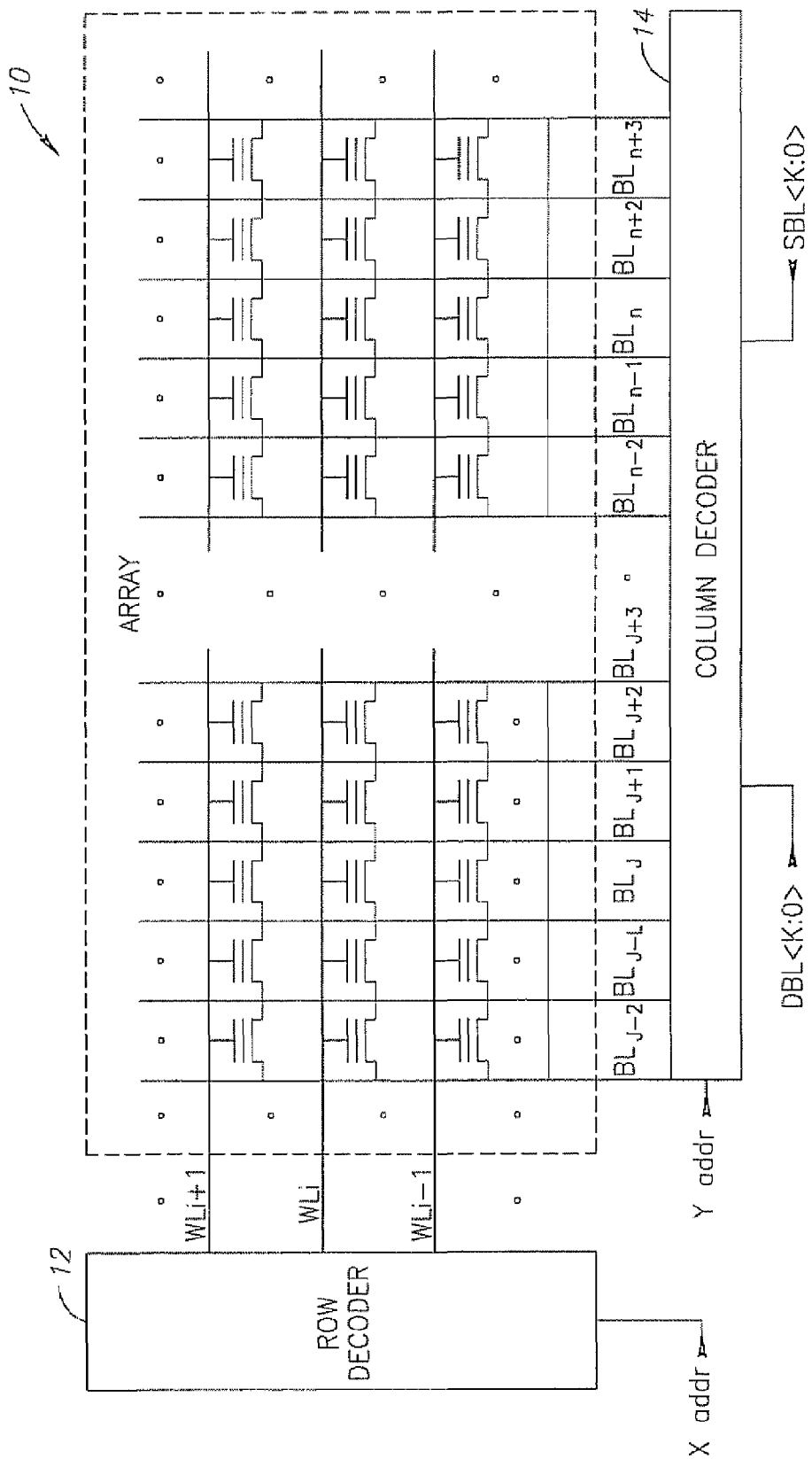
FIG. 3 is a simplified block diagram of a memory cell array, which may be read by the memory sensing system, in accordance with an embodiment of the present invention.

Reference is now made to FIG. 2, which illustrates a memory sensing system, constructed and operative in accordance with an embodiment of the present invention. Reference is also made to FIG. 3, which illustrates a memory cell array 10, which may be read by the memory sensing system, in accordance with an embodiment of the present invention.

Memory cells of array 10 are arranged in row and columns, and each memory cell is accessed during read, program, or erase operations by applying appropriate voltages associated word and bit lines. For example, as indicated in FIG. 3, the gate terminal of memory cell MCji is preferably connected to an associated word line (WL) WLi, and the drain and source terminals are preferably connected to associated bit lines (BLs) BLj and BLj+1.

Memory cells of array 10 may be addressed using a word line control circuit, i.e., row decoder 12, and a bit line control circuit, i.e., column decoder 14, according to input addresses signals Xaddr<h:0> and Yaddr<p:0>, respectively. Row decoder 12 provides an appropriated word line voltage to WL. Column decoder 14 connects selected drain bit lines (DBL) and source bit lines (SBL) of a memory cell to DBL and SBL inputs correspondingly.

As seen in FIGS. 2 and 3, a plurality of memory cells connected to the same selected word line may be accessed simultaneously. For example, k+1 memory cells may be accessed simultaneously Accordingly, column decoder 14 may have k+1 DBL and SBL nodes. DBL<k:0>, SBL<k:0>. As seen in FIG. 3, in accordance with one embodiment of the sensing method, the nodes SBL<k:0> may be connected to ground (GND) during the read operation. The source voltage of the selected memory cells may be close to GND.

As seen in FIG. 2, the memory sensing system may comprise one or more reference units 16 with one or more reference memory cells (RMCs) having a structure and current path therethrough similar to that of the array cells. The reference unit may emulate the elements found in the current path from node DBL through MC to be read to node SBL. This may provide RC (resistance-capacitance) matching of the two paths.

Figure 4:
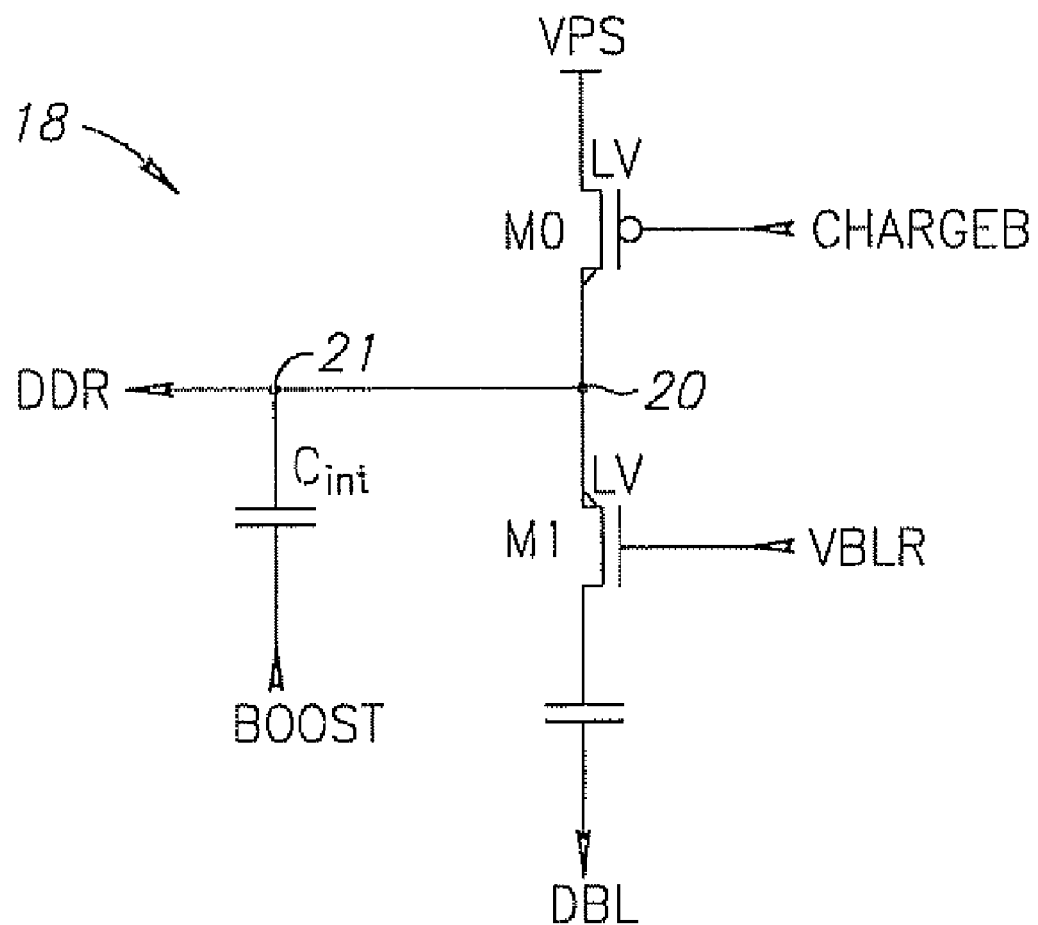
FIG. 4 is a simplified block diagram of a drain driver of the memory sensing system, constructed and operative in accordance with an embodiment of the present invention.

Drain drivers 18 may be provided for driving the drain bit lines of array 10 and the reference drain bit lines of reference units 16. Reference is now made to FIG. 4, which illustrates an example of a suitable drain driver 18, in accordance with an embodiment of the present invention. Drain driver 18 may comprise a PMOS (p-channel metal oxide semiconductor) pull-up transistor M0, wherein its gate terminal receives a logical signal input (chargeb), its source terminal receives a voltage input Vps and its drain terminal is connected to a node 20. An NMOS (n-channel metal oxide semiconductor) clamp transistor M1 may provided whose drain terminal is connected to the drain terminal of PMOS pull-up transistor M0 via node 20, whose gate terminal receives an input Vblr and whose source terminal is connected to the DBL input of the column decoder 14. An integrated capacitor Cint may be connected to a node 21, which is connected to a node 20 and a node ddr.

Drain driver 18 may execute two functions during a read operation:

a. provision of the required drain voltage of a memory cell during the read operation, and b. generation of a signal at node ddr (voltage Vddr) proportional to the current of a selected memory cell.

In order to provide the required drain voltage, the voltage Vps enters the drain of the NMOS clamp transistor M1 through the open PMOS pull-up transistor M0. The NMOS transistor M1, controlled by voltage Vblr at its gate, clamps its drain voltage Vps and transmits a reduced voltage Vd=Vblr−VgsM1 to the DBL input of the column decoder 14. The reduced voltage is transferred from the column decoder 14 to the drain terminal of the memory cell of the array 10.

The generation of the signal at node ddr is now explained with reference to FIG. 5, which illustrates waveforms of the drain driver signals, in accordance with an embodiment of the present invention. Before time T1, a logical signal chargeb is high and therefore PMOS pull-up transistor M0 is turned off (not conducting). At time T1, the signal chargeb goes down to 0V and turns on PMOS pull-up transistor M0 (i.e., it is now conducting). During the period of time right after time T1 and up to time T2, the signal ddr rises to Vps, and the drain bit line of the selected memory cell (both DBL nodes) becomes charged to voltage Vd. Current begins to flow through the memory cell. After the charging process to Vd is completed, the current of the path asymptotically stabilizes at the memory cell (MC) read current level, IMC.

Afterwards, at time T2, the signal chargeb returns to its high level Vps, thereby turning off PMOS transistor M0 again. Up until time T2, a signal boost may be optionally coupled to ground. Immediately after time T2, the signal boost may rise from 0V to Vboost. In response to the signal boost, the voltage of node ddr rises from its previous level Vps to voltage Vps+Vbst, where $$Vbst = Vboost \cdot C_\Sigma / C_{int} \qquad (2)$$

wherein $C_\Sigma$ is the total capacity of the node ddr;

Since the capacity Cint is significantly greater than other (parasitic) capacitors of the node ddr, $C\Sigma \approx Cint$ and $Vbst \approx Vboost$.

After time T2, the voltage Vddr decreases according to the equation $$V_{ddr\alpha}(t) = V_{ps} + Vboost - I_\alpha \cdot t / C_{int}, \; \alpha=0,k \qquad (3)$$

wherein $I_\alpha$ is the current though node $DBL_\alpha$, which equals $I_{MC}$.

As seen from equation (3), current IMCij is integrated on capacitor Cint. The voltage Vddr varies linearly with respect to the selected MC current IMCji and varies inversely with respect to the capacitance of capacitor Cint.

As long as Vddr is greater than Vd by some margin (e.g., on the order of about 0.2-0.3V) the NMOS transistor M1 works in saturation. The capacitance of the node ddr may be independent from the drain bit line capacitance, which may be a few orders of magnitude greater than Cint. The voltage of the nodes DBL, and BL may remain at Vd during the time that Vddr(t) is developing, and therefore the drain-source voltage of the selected memory cell MCji remains constant as well.

As mentioned previously, the drain drivers 18 for driving the drain bit lines of array 10 (i.e., drain drivers <0:k> in FIG. 2) are preferably identical to the drain drivers for the reference units 16 (i.e., drain drivers <ref0:refm> in FIG. 2). Therefore, the signals rddr<m:0> are developed similarly to ddr(t):

$$V_{rddr\beta}(t) = Vps + Vboost - I_\beta \cdot t / C_{int}, \; \beta=0,m \qquad (4)$$

wherein $I_\beta$ is the read current of α-th reference memory cell.

As seen in FIG. 2, the memory sensing system may comprise one or more comparators 22 for array 10 (i.e., comparators <0:k>) and for reference units 16 (i.e., comparators <ref0:refm>). Comparator 22 compares the analog voltage Vddr with a reference analog voltage Vcomp and generates an output digital signal amp according to the follow rule shown in Table 1:

TABLE 1

| Input voltages relation | cmp |
| --- | --- |
| Vddr > Vcomp | low |
| Vddr < Vcomp | high |

A voltage of the signal Vcomp is disposed in an interval [Vd, Vps+Vbst]. Hence, in the time interval T1 to T2, all signals cmp<0:k> are low (logical level "0"). The signal cmp may be inverted to a high logical level at time:

$$T_{cs\alpha} = T2 + (Vps + Vboost - Vcomp) \cdot Cint / I_\alpha, \; \alpha=0,k \qquad (5)$$

A similar equation determines a time when output signals of the comparators <ref0÷refit> may be inverted:

$$T_{res\beta} = T2 + (Vps + Vboost - Vcomp) \cdot Cint / I_\beta, \; \alpha=0,m \qquad (6)$$

As can be seen from equations (6) and (7), the values Tcsα and Trcsβ are an inverse function of the memory cell current.

Figure 6:
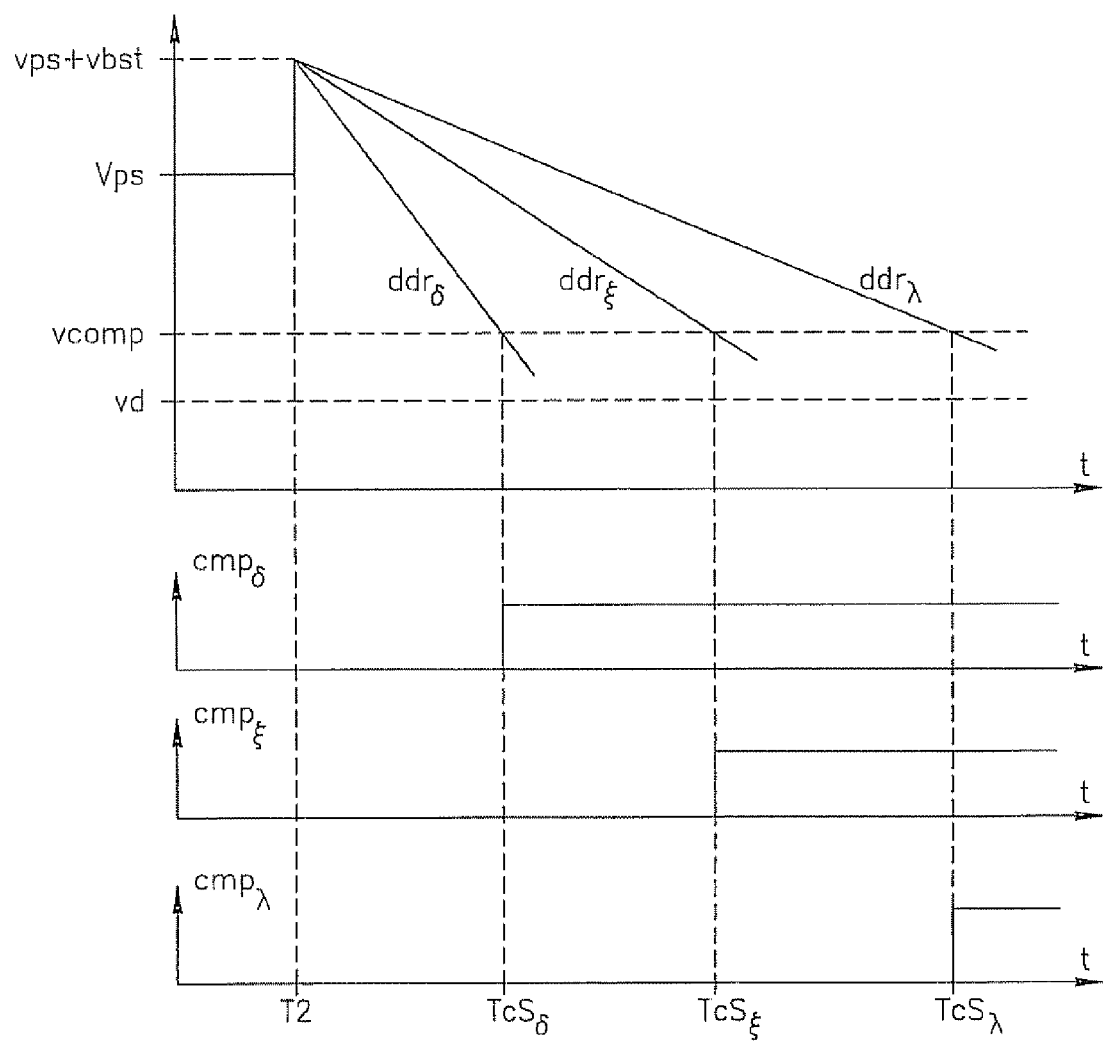
FIG. 6 is a simplified graphical illustration of waveforms of comparator signals of the memory sensing system of FIG. 2, in accordance with an embodiment of the present invention.

FIG. 6 illustrates waveforms of the comparator signals, in accordance with an embodiment of the present invention and the above explanation.

Referring again to FIG. 2, each comparator signal of the comparators 22 may be transmitted to the input of a data unit 24 together with the output signals lat<m:0> of the reference comparators. The data unit 24 may compare the rising time of the comparator signal Trise(cmp) with the rising time Trise (latξ), (ξ=0, . . . , m) of the output signals lat<m:0> of the reference comparators. Examples of output signals of the data unit 24 are shown in Table 2:

TABLE 2

| | $T_{rise}(\text{cmp}) > T_{rise}(\text{lat}_\xi)$ | | | | | | | |
| --- | --- | --- | --- | --- | --- | --- | --- | --- |
| | ξ | | | | | | | |
| | 0 ÷ m | 0 ÷ (m−1) | 0 ÷ (m−2) | 0 ÷ (m−3) | 0 ÷ (m−4) | 0 ÷ (m−5) | 0 ÷ (m−6) | 0 ÷ (m−7) |
| dt | 000 | 001 | 010 | 011 | 100 | 101 | 110 | 111 |

Figure 7:
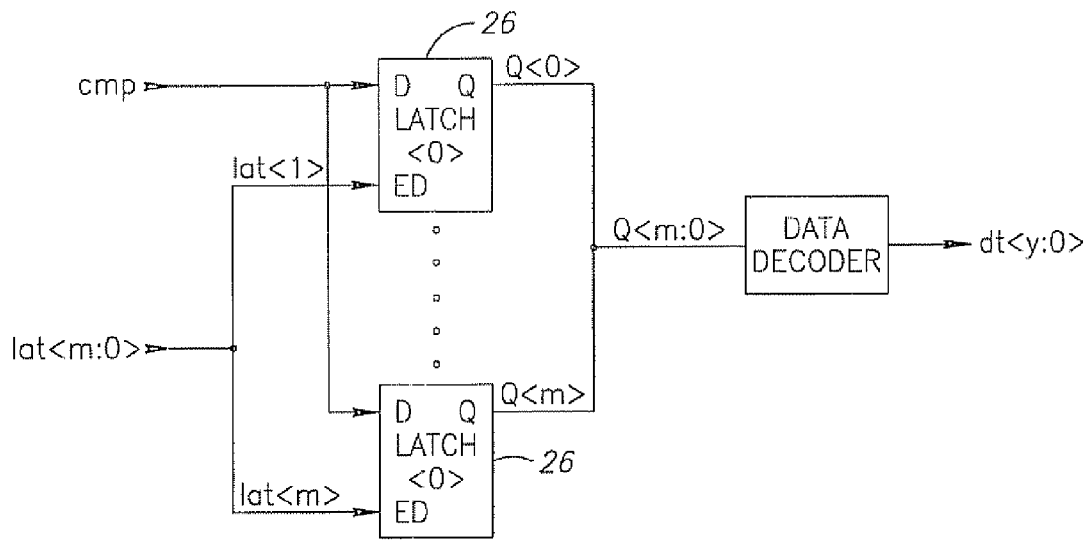
FIG. 7 is a simplified block diagram of a data unit of the memory sensing system, constructed and operative in accordance with an embodiment of the present invention.

Reference is now made to FIG. 7, which illustrates one example of data unit 24, constructed and operative in accordance with an embodiment of the present invention. The signal cmp is provided to the D-input of m digital latches 26, Each digital latch 26 may receive one of the tat signals of the reference comparators at its Eb-input. The digital latches 26 may function according to the follow rule shown in Table 3:

TABLE 3

| Eb | Q |
|----|------|
| 0  | D    |
| 1  | Hold |

When the Eb signal is a low level (logical "0"), the digital latch 26 transmits input signal D to output Q. When the Eb signal goes to a high level (logical "1"), the digital latch 26 transmits whatever the previous value was to output Q.

Figure 8:
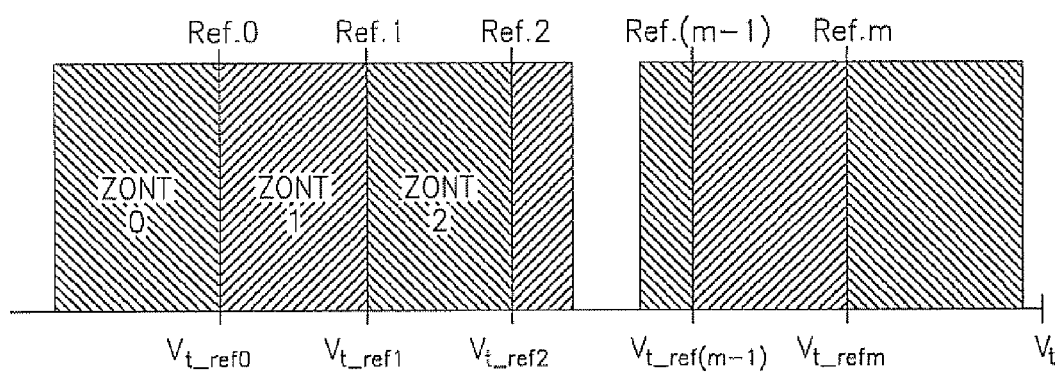
FIG. 8 is a simplified graphical illustration of the distribution of the threshold voltages of reference memory cells of the memory sensing system, in accordance with an embodiment of the present invention.

The reference units 16 (numbered 0 to m) shown in FIG. 2 may comprise reference memory cells (Ref0 to Refm). Reference is now made to FIG. 8, which illustrates a distribution of the threshold voltages (Vtref0 to Vtrefm) of the reference memory cells, in accordance with an embodiment of the present invention. The threshold voltages may be distributed in m+1 zones in intervals along the Vt axis. For example, the threshold voltage Vto of some cell, which corresponds with the channel number $\alpha$ of the sensing (dbl<$\alpha$>-ddr<$\alpha$> - cmp<$\alpha$a>), may be in zone $\tau$. This means that the threshold voltage Vto is greater than the threshold voltages in the previous zones (that is, Vtref0 to Vtref($\tau$−1)), and less than the threshold voltages in the next zones (that is, Vtref$\tau$ to Vtrefm). Accordingly, the current Io of that cell is greater than the current in the next zones (Iref$\tau$ to Irefm), and less than the current in the previous zones (Iref0 to Iref($\tau$−1)). Hence, the signal cmp<$\alpha$> corresponding to that cell rises earlier than signals lat<$\tau$>÷lat<m>, and later than signals lat<0>÷lat<$\tau$−1>. Accordingly, internal signals Q<m;0> of the data unit number $\alpha$ are given by the following equation:

$$Q<(\tau-1):0>=0, Q<m:\tau>=1.$$

A data decoder may convert signals Q<m:0> to a final data bus dt<y:0> according to the rule (in decimal form):

$$dt_{decimal}=Q<0>+Q<1>+Q<2>+\ldots+Q<m-1>+Q<m>.$$

A binary form of the data may be obtained by a conventional formula for decimal to binary conversion:

$$dt_{decimal}=dq<0>*2^0+dq<1>*2^1+dq<2>*2^2+dq<3>*2^3+\ldots+dq<y>*2^{\hat{0}}y.$$

or in table form in Table 4:

TABLE 4

| | Q | | | | | | |
|---|---|---|---|---|---|---|---|
| | 0 | 1 | 11 | 111 | 1111 | 11111 | 111111 | 1111111 |
| $dt_{decimal}$ | 0 | 1 | 2 | 3 | 4 | 5 | 6 | 7 |
| $dt_{binary}$ | 0 | 1 | 10 | 11 | 100 | 101 | 110 | 111 |

The relation between the reference channel number (m) and the bit number of the signal dt (y) may be expressed as follows:

$$m=2\hat{0}y-1,$$

or in table form in Table 5:

TABLE 5

| | m | | | | |
|---|---|---|---|---|---|
| | 1 | 3 | 7 | 15 | 31 |
| y | 1 | 2 | 3 | 4 | 5 |

An operation voltage Vps of the memory sensing system may equal:

$$Vps_{\_min}=V_{M1ds}+V_{cd}+V_{MCds}+V_{cd}, \quad (7)$$

where $V_{M1ds}$ is the drain/source voltage of the transistor M1 in the drain driver;

$V_{cd}$ is the column decoder voltage drop; and $V_{MCds}$ is the drain/source voltage of the memory cell.

As mentioned previously in the background of the invention, the minimum supply voltage VDD_MIN of the prior art is equal to 2.9 V, and the prior art memory device 100 cannot be used in applications that use a VDD supply voltage lower than 2.9 V. However, in the present invention, the minimum supply voltage Vps_min is less than the prior art VDD_MIN (see equation (1) above in the background of the invention) by VDIODE_MAX, and approaches the minimal voltage VBL_MIN. VDIODE_MAX may be approximately equal to one volt, for example. This means that the present invention may be used in applications that use a VDD supply voltage lower than 2.9 V, down to 1.9 V, an improvement of over 34%.

Thus, the present invention may transform a signal (e.g., current) from the memory cell to a time delay (e.g., a digital signal delay) and compare the time delay to a time delay of a reference cell (e.g., the rise or fall times of the signals). The drain driver operates at a low (close to minimal) voltage to generate the analog signal Vddr. The signal Vddr is preferably linearly dependent upon the memory cell current. The memory cell current is preferably integrated on the local capacitor.

The present invention may he used as a multi-level sensing system for a multiplicity of reference units. In addition, the invention may also be used for a single reference unit.

It is noted that in the prior art, signals from the memory cells are coupled in a one-to-one correspondence to the sense amplifiers. There is the same number of signals as there are sense amplifiers. However, the reference memory cells are coupled in parallel to all of the sense amplifiers. This results in a significant mismatch between two sense amplifier input signals, because one of them (from the array) is connected to a single sense amplifier whereas the other (from the reference) is connected to all of the sense amplifiers. The mismatch may lead to errors in read data. In contrast, in the present invention, all the analog signals from the array cells and the reference cells are matched, as described hereinabove.

Figure 5:
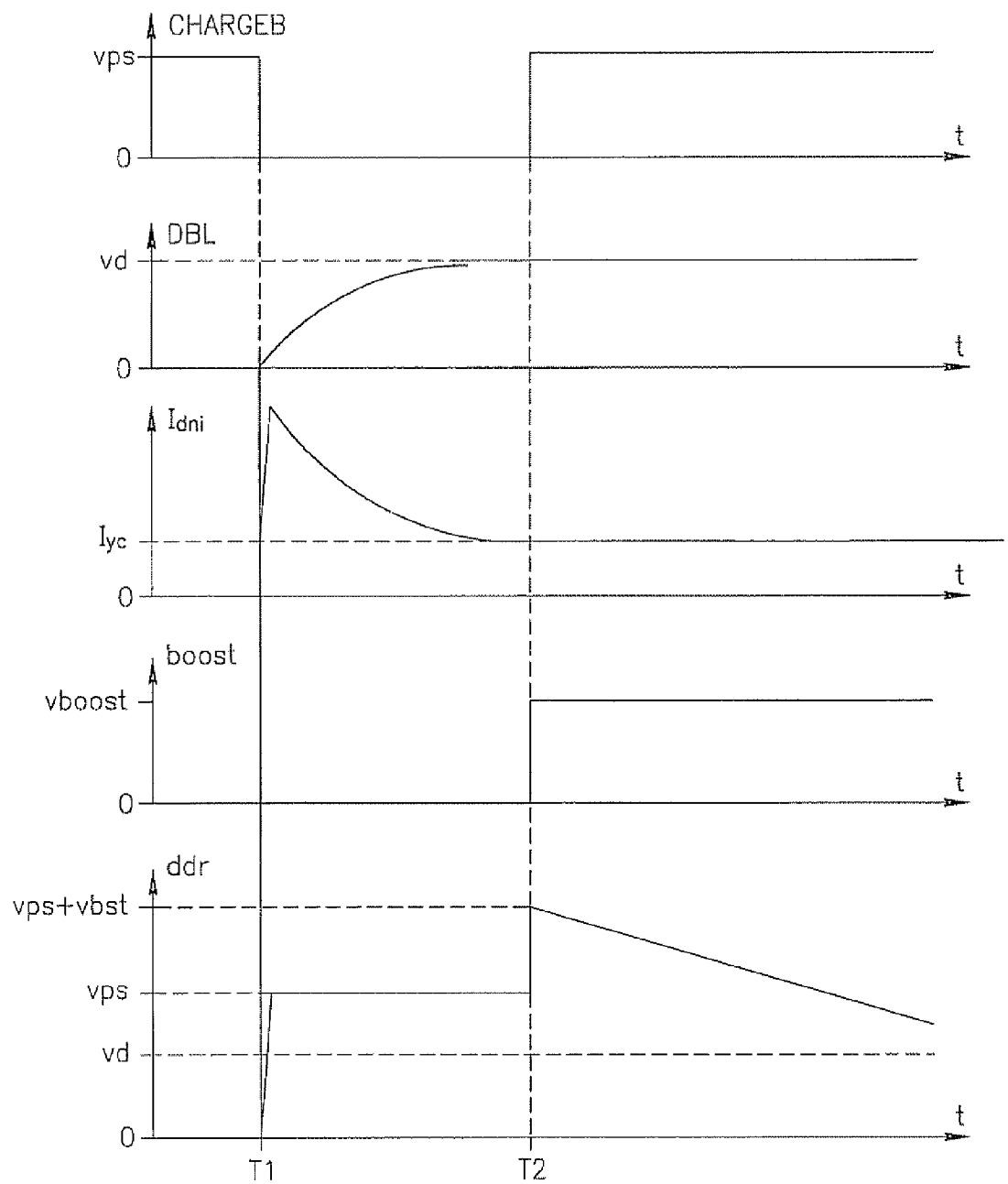
FIG. 5 is a simplified graphical illustration of waveforms of the drain driver signals, in accordance with an embodiment of the present invention.
Figure 9:
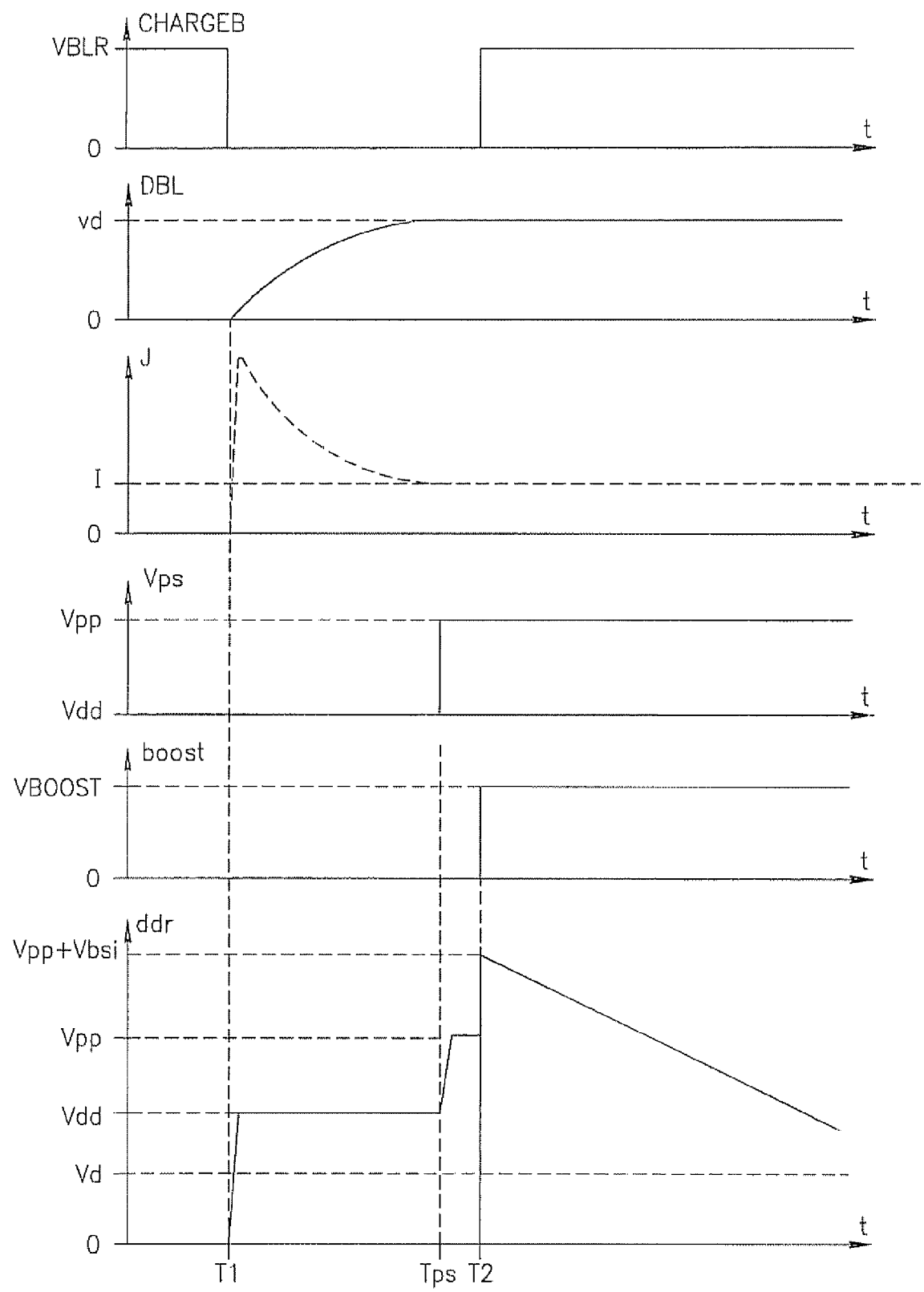
FIG. 9 is a simplified graphical illustration of waveforms of the drain driver signals, in accordance with another embodiment of the present invention, different from that of FIG. 5.

Reference is now made to FIG. 9, which illustrates waveforms of the drain driver signals, in accordance with another embodiment of the present invention, different from that of FIG. 5. In this embodiment, node Vps is connected to the system voltage supply Vdd until a time Tps, when power dissipation is maximal for charging the read path parasitic capacitors. At time Tps, the current through node Vps is significantly lower (e.g., practical equal to IMC), and node Vps is switched to a higher voltage supply than Vdd. This embodiment may be useful to increase the possible range of boosting Vddr.

Figure 10:
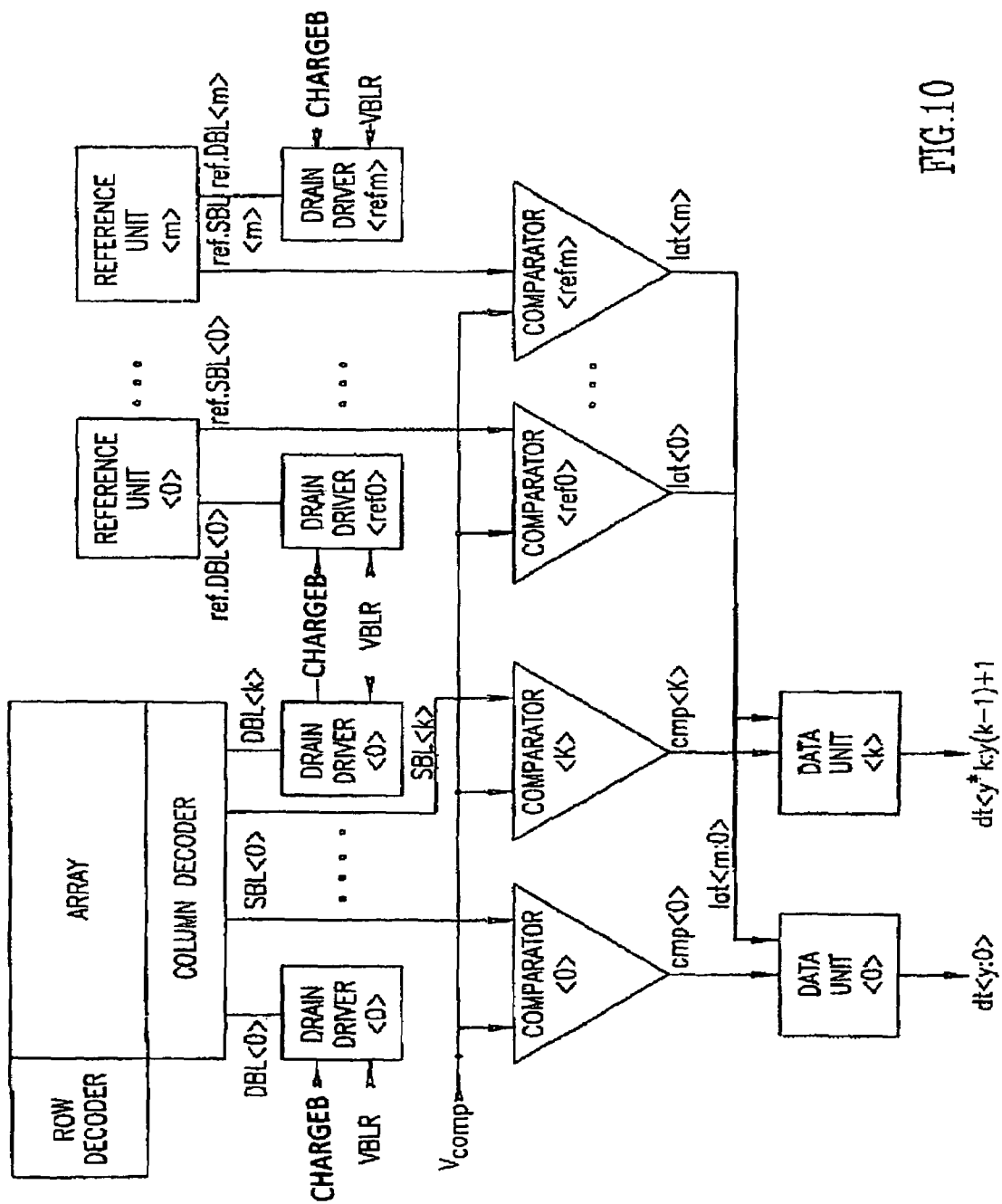
FIG. 10 is a simplified block diagram of a memory sensing system, in accordance with another embodiment of the present invention.
Figure 11:
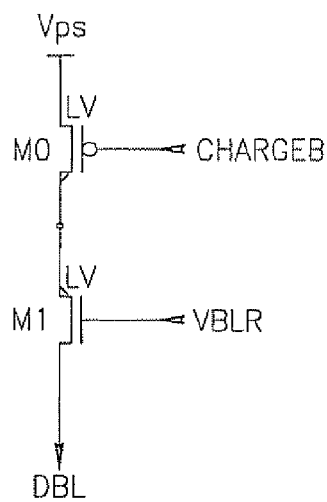
FIG. 11 is a simplified block diagram of the drain driver for the embodiment of FIG. 10, constructed and operative in accordance with an embodiment of the present invention.
Figure 12:
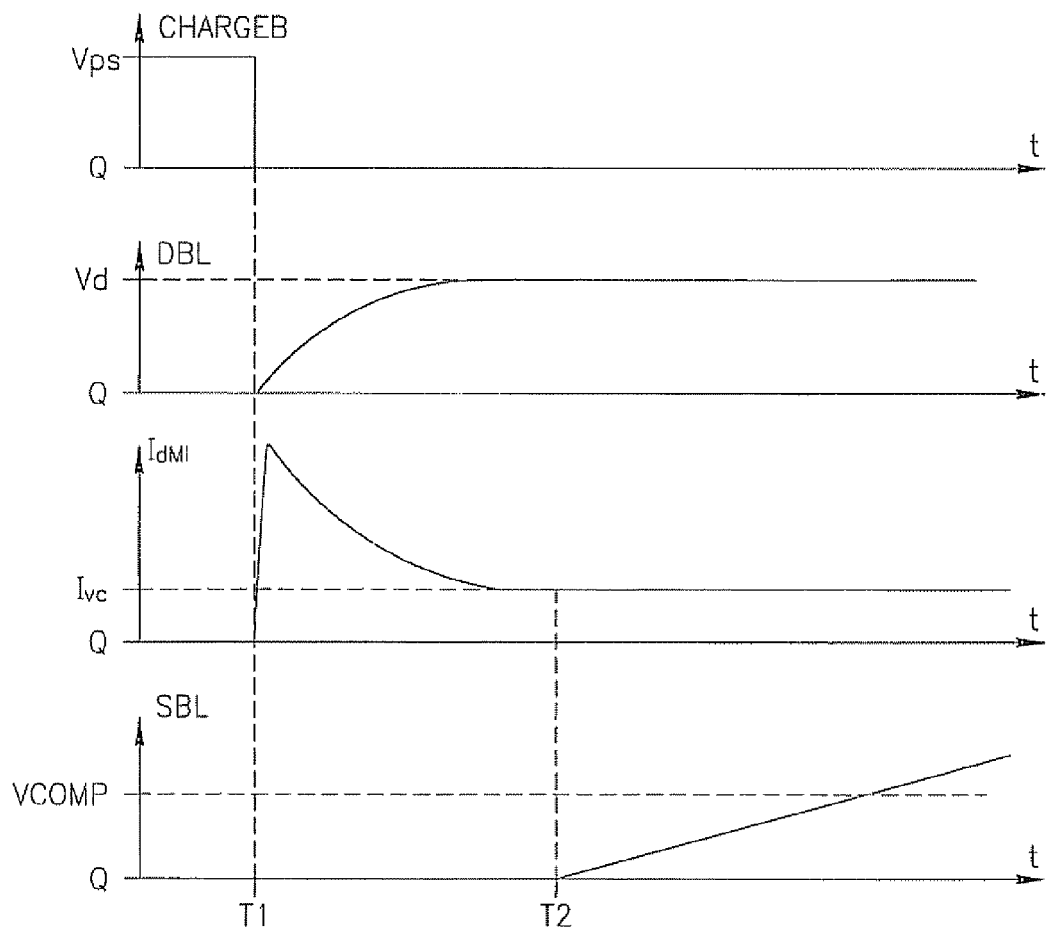
FIG. 12 is a simplified graphical illustration of the waveforms of the drain driver signals, for the embodiment of FIG. 10.

Reference is now made to FIG. 10, which illustrates a memory sensing system, in accordance with another embodiment of the present invention, and to FIG. 11, which illustrates the drain driver for the embodiment of FIG. 10. In this embodiment, the nodes SBL<k:0> may be connected to the comparator inputs instead of the ddr<k:0> signals, as shown in FIG. 10. The drain driver circuit is a simplified version of the drain driver circuit of FIG. 4. FIG. 12 illustrates the waveforms of the drain driver signals, in accordance with this embodiment of the invention. The development of the signals SBL<k:0> may be as described in U.S. Pat. No. 6,128,226 to Eitan and Dadashev, assigned to the common assignee of the present application.

It will be appreciated by persons skilled in the art that the present invention is not limited by what has been particularly shown and described hereinabove. Rather the scope of the present invention includes both combinations and subcombinations of the features described hereinabove as well as modifications and variations thereof which would occur, to a person of skill in the art upon reading the foregoing description and which are not in the prior art.

What is claimed:

1. A reference cell comparator comprising: a first input terminal functionally associated with a reference cell; a second input terminal functionally associated with a multi-comparator signal line; and an output terminal adapted to provide a trigger signal when input signals at the first and second input terminal substantially meet a predefined criteria, wherein said trigger signal is adapted to trigger sampling of an output of a data cell comparator functionally associated with the multi comparator signal line; and wherein said reference cell and the data cell have matched sensing paths.

2. The comparator according to claim 1, wherein the second input terminal is adapted to receive a voltage signal.

3. The comparator according to claim 2, wherein the first input terminal is adapted to receive a voltage signal.

4. The comparator according to claim 1, wherein the first input terminal is adapted to receive a current signal.

5. The comparator according to claim 4, wherein the comparator is adapted to convert a current signal to a voltage signal.

6. The comparator according to claim 2, wherein the comparator is adapted to produce a trigger signal when a voltage level of the signal at the first terminal reaches a voltage level of the signal at the second terminal.

7. The comparator according to claim 1 further comprising a sense amplifier.

8. The comparator according to claim 1 further comprising a current to voltage conversion circuit.

9. A data cell comparator comprising: a first input terminal functionally associated with a data cell; a second input terminal functionally associated with a multi-comparator signal line; and an output terminal adapted for sampling when input signals at first and second input terminals of a reference cell comparator functionally associated with the multi-comparator signal line substantially meet a predefined criteria, wherein said reference cell and said data cell have matched sensing paths.

10. The comparator according to claim 9, further comprising a sense amplifier.

11. The comparator according to claim 9, wherein the second input terminal is adapted to receive a voltage signal.

12. The comparator according to claim 9, wherein the first input terminal is adapted to receive a voltage signal.

13. The comparator according to claim 9, further comprising a current to voltage conversion circuit.

14. The comparator according to claim 9, wherein the first input terminal is adapted to receive a current signal.

15. The comparator according to claim 14, wherein the comparator is adapted to convert a current signal to a voltage signal.

16. The comparator according to claim 11, wherein the output terminal provides a signal indicating whether a voltage level of the signal at the first input terminal reaches a voltage level of the signal at the second input terminal.

17. A data unit comprising: a register adapted to receive an output signal of a data cell comparator associated with a multi-comparator signal line substantially when input signals at first and second input terminals of a reference cell comparator functionally associated with the multi-comparator signal line substantially meet a predefined criteria, wherein said reference cell and said data cell have matched sensing paths.

18. The data unit according to claim 17 adapted to receive a trigger signal from the reference comparator.

19. The data unit according to claim 18 adapted to receive the output signal of the data cell comparator upon receiving the trigger signal.

20. The data unit according to claim 19 adapted to receive the output signal of the data cell comparator upon receiving a signal derived from the trigger signal

* * * * *